US012610549B2

(12) United States Patent
Cheng et al.

(10) Patent No.: US 12,610,549 B2
(45) Date of Patent: Apr. 21, 2026

(54) MEMORY DEVICE WITH REDUCED GLOBAL SELECTION LINE STRUCTURES AND METHOD OF FABRICATING THE SAME

(71) Applicant: MACRONIX International Co., Ltd., Hsinchu (TW)

(72) Inventors: Chen-Yu Cheng, Hsinchu City (TW); Tzung-Ting Han, Hsinchu City (TW)

(73) Assignee: MACRONIX International Co., Ltd., Hsinchu (TW)

( * ) Notice: Subject to any disclaimer, the term of this patent is extended or adjusted under 35 U.S.C. 154(b) by 535 days.

(21) Appl. No.: 18/169,877

(22) Filed: Feb. 16, 2023

(65) Prior Publication Data

US 2024/0284669 A1    Aug. 22, 2024

(51) Int. Cl.
H10B 43/27 (2023.01)

(52) U.S. Cl.
CPC ................................... H10B 43/27 (2023.02)

(58) Field of Classification Search
CPC ........ H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50;

(Continued)

(56) References Cited

U.S. PATENT DOCUMENTS

| | | | |
|---|---|---|---|
| 2016/0019973 A1 | 1/2016 | Park et al. | |
| 2019/0326218 A1* | 10/2019 | Chen ....................... | H10B 41/10 |
| 2019/0393240 A1* | 12/2019 | Kim ....................... | H10B 43/40 |

(Continued)

FOREIGN PATENT DOCUMENTS

| | | |
|---|---|---|
| CN | 114078506 | 2/2022 |
| TW | 202141698 | 11/2021 |
| TW | 202224095 | 6/2022 |

OTHER PUBLICATIONS

"Office Action of Taiwan Counterpart Application", issued on Feb. 17, 2024, pp. 1-3.

*Primary Examiner* — William B Partridge
*Assistant Examiner* — Gustavo G Ramallo
(74) *Attorney, Agent, or Firm* — J.C. PATENTS

(57) ABSTRACT

A memory device includes a substrate and a stack structure. A lower portion of the stack structure includes a first global selection line structure and a second global selection line structure. The first global selection line structure includes a first long strip, a first short strip and a first connection part connecting the first long strip and the first short strip. The first long strip and the second strip extend in a first direction, and the first connection part extends in a second direction different from the first direction. The first long strip passes through a staircase structure area from a first memory array area extending continuously to a second memory array area. The second global selection line structure is adjacent to the first global selection line structure and is divided into two portions separated from each other by the first connection part of the first global selection line structure.

20 Claims, 32 Drawing Sheets

(58) Field of Classification Search
CPC ........ H10B 51/00; H10B 51/10; H10B 51/20;
H10B 51/30; H10B 51/40; H10B 51/50
See application file for complete search history.

(56) References Cited

U.S. PATENT DOCUMENTS

| 2020/0098748 | A1  |   | 3/2020 | Xiao et al. |
| 2022/0199134 | A1* |   | 6/2022 | Cheng ................... H10B 41/10 |

* cited by examiner

MEMORY DEVICE WITH REDUCED GLOBAL SELECTION LINE STRUCTURES AND METHOD OF FABRICATING THE SAME

BACKGROUND

Technical Field

The embodiment of the disclosure relates to a semiconductor device and a method of fabricating the same, and particularly, to a memory device and a method of fabricating the same.

Description of Related Art

Since a non-volatile memory device (e.g., a flash memory) has the advantage that stored data does not disappear at power-off, it becomes a widely used memory device for a personal computer or other electronics equipment.

Currently, the flash memory array commonly used in the industry includes a NOR flash memory and a NAND flash memory. Since the NAND flash memory has a structure in which memory cells are connected together in series, degree of integration and area utilization thereof are better than those of the NOR flash memory. Thus, the NAND flash memory has been widely used in a variety of electronic products. Besides, to further enhance the degree of integration of the memory device, a three-dimensional NAND flash memory has been developed. However, there are still some challenges associated with the three-dimensional NAND flash memory.

SUMMARY

The disclosure provides a memory device capable of reducing wiring of a plurality of global selection line structures and reducing complexity of the fabrication process.

According to an embodiment of the disclosure, a memory device includes a substrate and a stack structure. The substrate includes a first memory array area, a second memory array area, and a staircase structure area between the first memory array area and a second memory array area. The stack structure includes a plurality of insulating layers and a plurality of conductive layers stacked alternately over the substrate in the first memory array area, the second memory array area and the staircase structure area. A lower portion of the stack structure includes a plurality of global selection line structures in the first memory array area, the second memory array area and the staircase structure area. The plurality of global selection line structures include a first global selection line structure and a second global selection line structure. The first global selection line structure includes a first long strip, a first short strip and a first connection part connecting the first long strip and the first short strip. The first long strip passes through the staircase structure area from the first memory array area extending continuously to the second memory array area. The second global selection line structure is adjacent to the first global selection line structure and is divided into two portions separated from each other by the first connection part of the first global selection line structure.

According to an embodiment of the disclosure, a method of fabricating a memory device includes steps below. A substrate is provided. The substrate includes a first memory array area, a second memory array area, and a staircase structure area between the first memory array area and a second memory array area. The stack structure includes a plurality of insulating layers and a plurality of conductive layers stacked alternately over the substrate in the first memory array area, the staircase structure area and the second memory array area. A lower portion of the stack structure includes a plurality of global selection line structures in the first memory array area, the second memory array area and the staircase structure area. The plurality of global selection line structures include a first global selection line structure and a second global selection line structure. The first global selection line structure includes a first long strip, a first short strip and a first connection part connecting the first long strip and the first short strip. The first long strip and the second strip extend in a first direction and the first connection part extends in a second direction different from the first direction. The first long strip and the second strip extend in a first direction, and the first connection part extend in a second direction different from the first direction. The first long strip passes through the staircase structure area from the first memory array area extending continuously to the second memory array area. The second global selection line structure is adjacent to the first global selection line structure and is divided into two portions separated from each other by the first connection part of the first global selection line structure.

According to an embodiment of the disclosure, a memory device includes a substrate and a stack structure. The substrate includes a first memory array area, a second memory array area, and a staircase structure area between the first memory array area and a second memory array area. The stack structure includes a plurality of insulating layers and a plurality of conductive layers stacked alternately over the substrate in the first memory array area, the second memory array area and the staircase structure area. A lower portion of the stack structure includes a plurality of global selection line structures in the first memory array area, the second memory array area and the staircase structure area. The plurality of global selection line structures include a first global selection line structure and a second global selection line structure. The first global selection line structure includes a first long strip, a first short strip and a first connection part connecting the first long strip and the first short strip. The first long strip and the second strip extend in a first direction, and the first connection part extends in a second direction different from the first direction. The first long strip and the second strip extend in a first direction, and the first connection part extend in a second direction different from the first direction. The first long strip passes through the staircase structure area from the first memory array area extending continuously to the second memory array area. The second global selection line structure is adjacent to the first global selection line structure and is divided into two portions separated from each other by the first connection part of the first global selection line structure. The bottom slit separates the second global selection line structure from the first global selection line structure. Each of the plurality of conductive layers over the first long strip, the first short strip and the first connection part of the first global selection line structure is integrated.

Based on the above, the plurality of global selection line structures of the embodiments of the disclosure include staircase parts that are disposed to be adjacent to each other directly through the patterning and layout of the stack structures below, without passing through a metal interconnect. Therefore, wiring can be reduced and complexity of the fabrication process can be reduced.

BRIEF DESCRIPTION OF THE DRAWINGS

FIG. 5A to FIG. 5M are cross-sectional views taken along lines I-I', II-II', and III-III' of FIG. 1A.

DESCRIPTION OF THE EMBODIMENTS

Figure 1A:
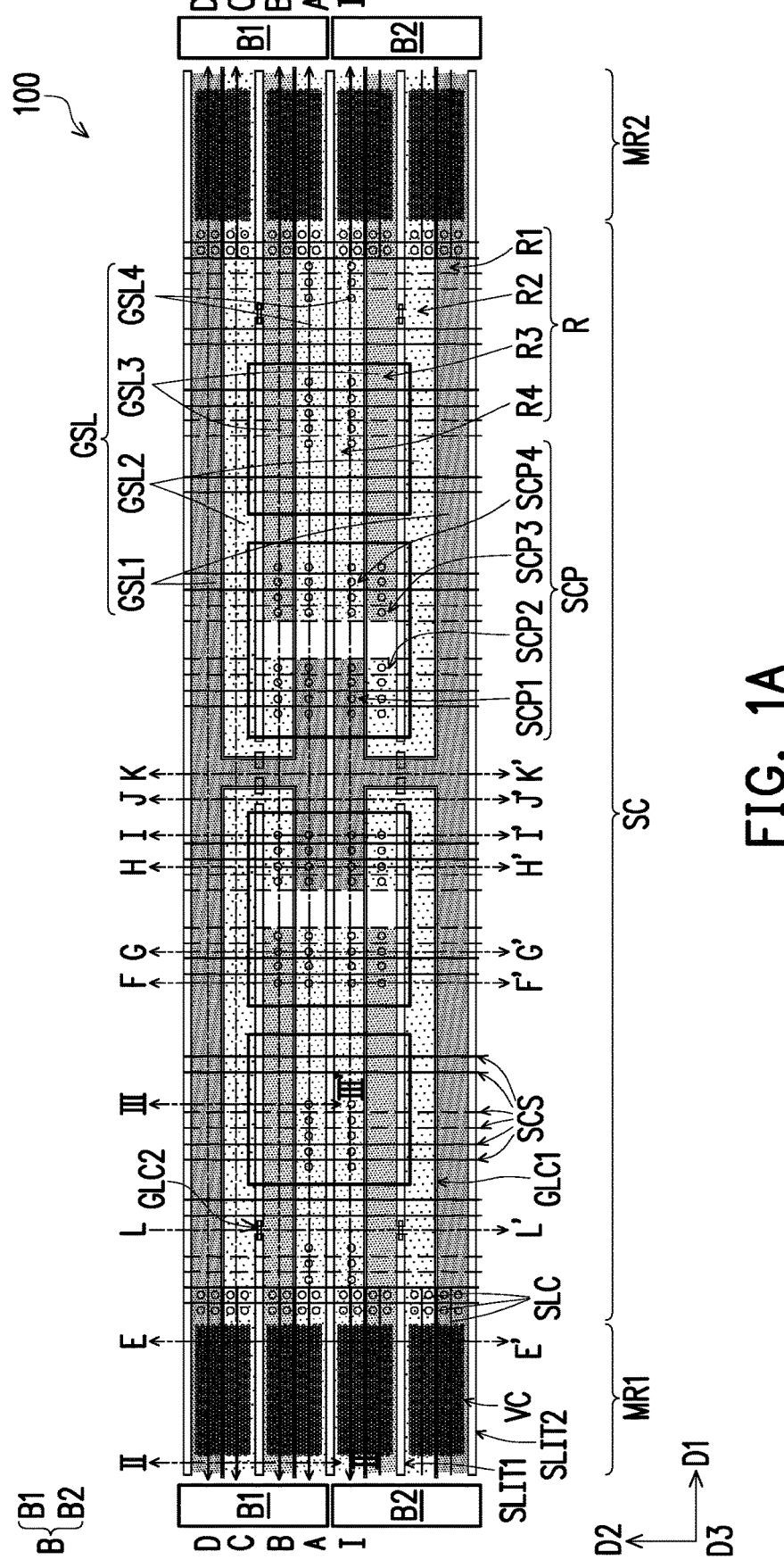
FIG. 1A is a top view of a semiconductor device according to an embodiment of the disclosure.
Figure 1B:
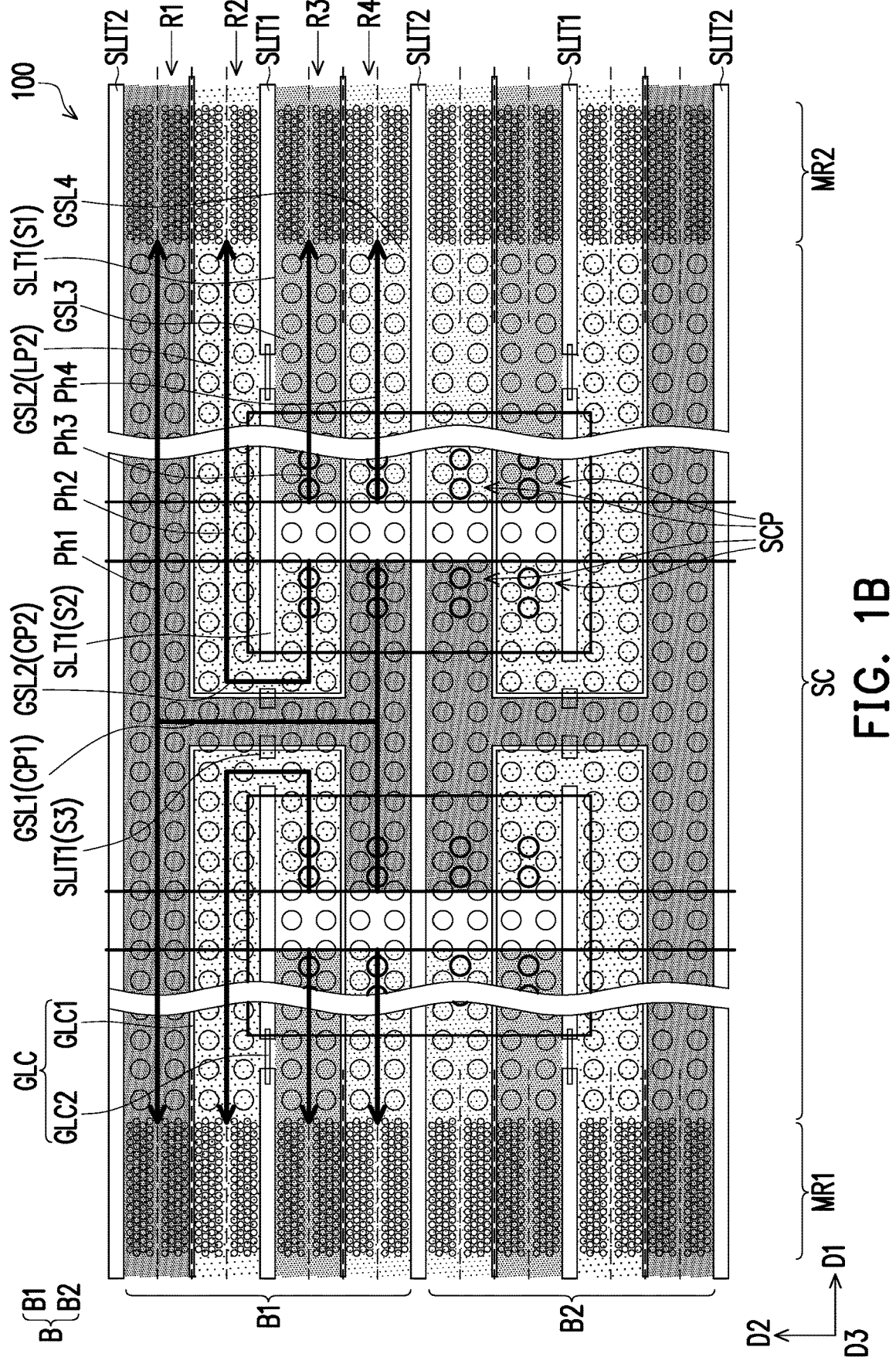
FIG. 1B is a schematic partially enlarged view of FIG. 1A.

FIG. 1A is a top view of a semiconductor device according to an embodiment of the disclosure. FIG. 1B is a schematic partially enlarged view of FIG. 1A.

Referring to FIG. 1A and FIG. 1B, a semiconductor device 100 includes a plurality of blocks B. FIG. 1A only shows blocks B1 and B2, but the embodiment of the disclosure is not limited thereto, and the semiconductor device 100 may further include other blocks. The semiconductor device 100 is formed on a substrate 10. The substrate 10 may be a semiconductor substrate, such as a silicon-containing substrate. In the embodiment of the disclosure, the substrate 10 in each block B includes a plurality of regions R, such as a first region R1, a second region R2, a third region R3, and a fourth region R4 (as shown in FIG. 1B). The first region R1, the second region R2, the third region R3, and the fourth region R4 are, for example, a plurality of long rectangles extending along a direction D1 and arranged along a direction D2.

Referring to FIG. 1A and FIG. 1B, in an embodiment of the disclosure, the semiconductor device 100 includes a first memory array area MR1, a second memory array area MR2, and a staircase structure area SC. The first memory array area MR1 and the second memory array area MR2 are disposed at two ends of the first region R1, the second region R2, the third region R3, and the fourth region R4. The staircase structure area SC is disposed in the first region R1, the second region R2, the third region R3, and the fourth region R4 laterally sandwiched between the first memory array area MR1 and the second memory array area MR2.

FIG. 2A to FIG. 2K are cross-sectional views taken along lines A-A', B-B', C-C', D-D', E-E', F-F', G-G', H-H', I-I', J-J', K-K', and L-L' of FIG. 1A. FIG. 3 is a cross-sectional view taken along line A-A' of FIG. 1A according to another embodiment.

Figure 2A:
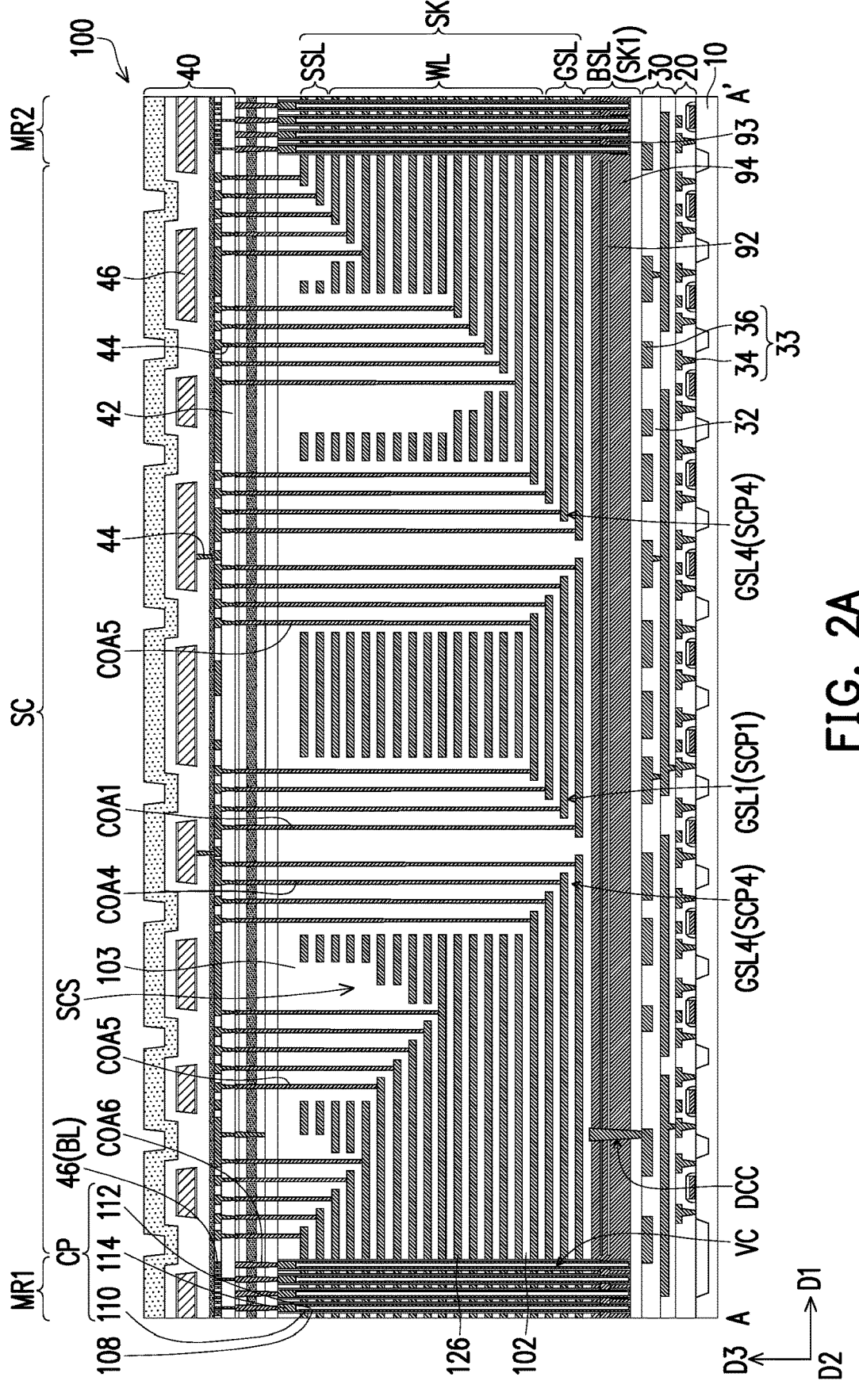
FIG. 2A to FIG. 2L are cross-sectional views taken along lines A-A', B-B', C-C', D-D', E-E', F-F', G-G', H-H', I-I', J-J', K-K' and L-L' of FIG. 1A.
Figure 3:
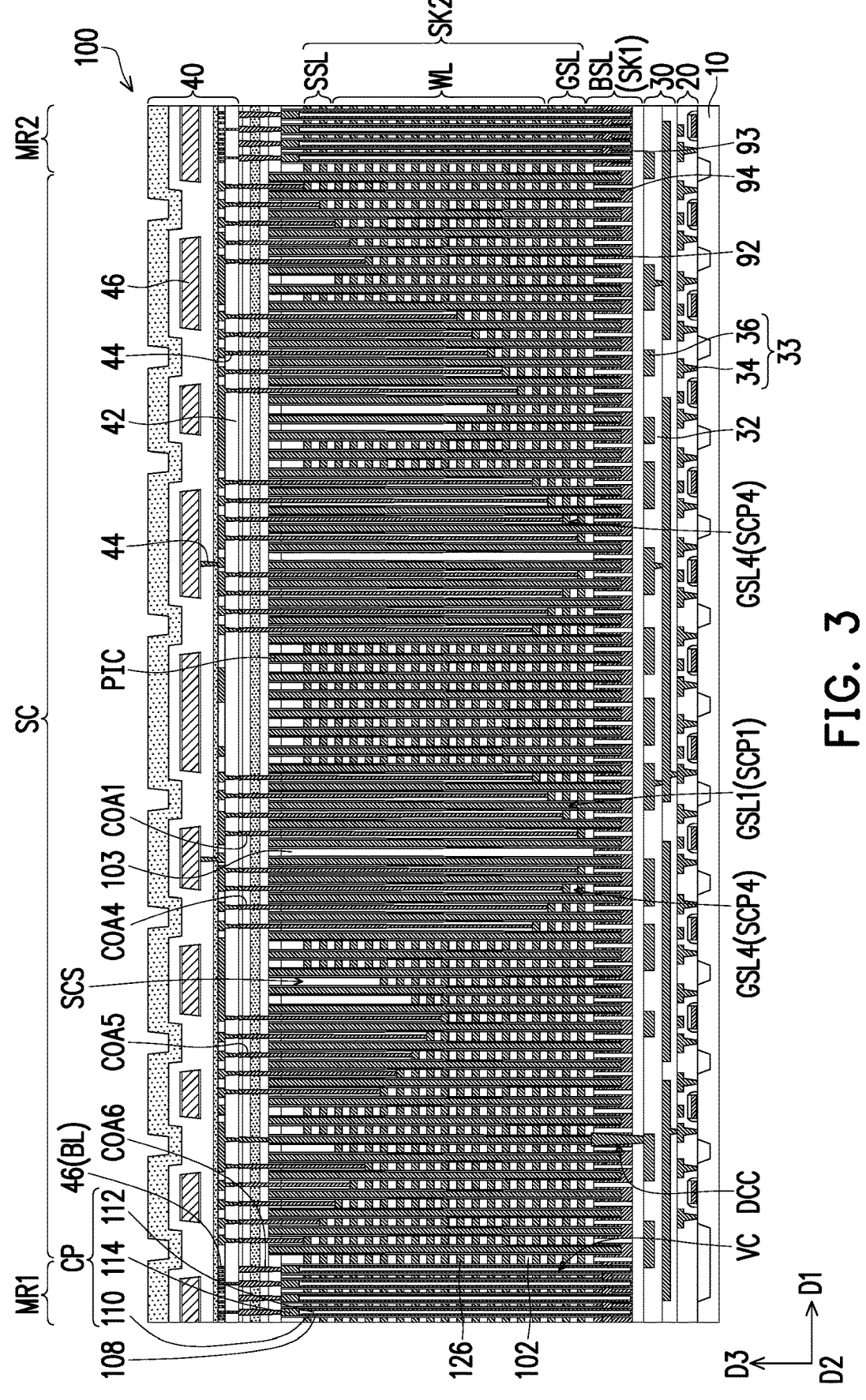
FIG. 3 is a cross-sectional view taken along line A-A' of FIG. 1A according to another embodiment.

Referring to FIG. 2A, in a direction D3, a device layer 20 is formed on the substrate 10. The device layer 20 may include an active device or a passive device. The active device is, for example, a transistor, a diode, etc. The passive device is, for example, a capacitor, an inductor, etc. The transistor may be an N-type metal-oxide-semiconductor (NMOS) transistor, a P-type metal-oxide-semiconductor (PMOS) transistor, or a complementary metal-oxide-semiconductor (CMOS) device. Since the device layer 20 is formed below memory arrays, and the device layer 20 is, for example, a complementary metal-oxide-semiconductor (CMOS) device, this architecture may also be referred to as a CMOS-Under-Array (CUA) structure.

Referring to FIG. 2A, in the direction D3, a metal interconnect structure 30 is further formed over the device layer 20. The metal interconnect structure 30 may include a plurality of dielectric layers 32 and metal interconnects 33 formed in the dielectric layers 32. The metal interconnects 33 include a plurality of plugs 34, a plurality of conductive lines 36, etc. The dielectric layers 32 separate adjacent conductive lines 36. The conductive lines 36 may be connected to each other through the plugs 34, and the conductive lines 36 may be connected to the device layer 20 through the plugs 34.

Referring to FIG. 2A, in the direction D3, a stack structure SK1 is further formed over the metal interconnect structure 30. The stack structure SK1 may include a plurality of insulating layers 92 and a plurality of conductive layers 93 and 94. In an embodiment, the material of the insulating layer 92 includes silicon oxide, and the material of the conductive layers 93 and 94 includes doped polysilicon. The numbers of the insulating layers 92 and the conductive layers 93 and 94 are not limited to those shown in the figures. A part of the conductive layers in the stack structure SK1 may serve as a common source line BSL, or referred to as a common source conductive layer.

Referring to FIG. 2A, a conductive pillar DCC may be provided in the stack structure SK1. The conductive pillar DCC has a low resistance. In an embodiment, the conductive layer 94 is doped polysilicon, and the conductive pillar DCC is metal such as tungsten, titanium nitride, tantalum, or a combination thereof. The resistance of the conductive pillar DCC is lower than the resistance of the source line BSL. The conductive pillar DCC is electrically connected to the top-most conductive line 36. In some embodiments, the topmost conductive line 36 electrically connected to the conductive pillar DCC is further electrically connected to the substrate 10 and grounded. Therefore, the conductive pillar DCC may serve as a discharge path.

Referring to FIG. 2A, a stack structure SK2 is formed over the stack structure SK1. The stack structure SK2 includes a plurality of insulating layers 102 and a plurality of conductive layers 126 stacked alternately in the direction D3. The numbers of the insulating layers 102 and the conductive layers 126 are not limited to those shown in the figures. In an embodiment, the material of the insulating layer 102 includes silicon oxide. The conductive layer 126 includes, for example, a barrier layer and a metal layer. In an embodiment, the material of the barrier layer includes titanium (Ti), titanium nitride (TiN), tantalum (Ta), tantalum nitride (TaN), or a combination thereof, and the material of the metal layer includes tungsten (W). In some embodiments, polysilicon is originally provided at positions of the conductive layers 126, which are formed through a gate replacement process.

Referring to FIG. 1A and FIG. 2A, the staircase structure SCS is located in the stack structure SK2 in the staircase structure area SC between the first memory array area MR1 and the second memory array area MR2. The staircase structure SCS includes conductive layers 126 having differing lengths. The closer the conductive layer 126 is to the substrate 10, the greater the length of the conductive layer 126 is. The farther the conductive layer 126 is away from the substrate 10, the less the length of the conductive layer 126 is.

Referring to FIG. 2A, the stack structure SK2 may include a lower portion, a middle portion, and an upper portion. The lower portion of the stack structure SK2 serves as a plurality of global selection line structures GSL. The middle portion of the stack structure SK2 serves as word lines WL. The upper portion of the stack structure SK2 serves as string selection lines SSL. In an embodiment of the disclosure, the lower portion of the stack structure SK2 serving as the plurality of global selection line structures GSL includes a plurality of insulating layers 102 and a plurality of conductive layers 126, for example, including three insulating layers 102 and three conductive layers 126, but the disclosure is not limited thereto. The middle portion of the stack structure SK2 serving as the word lines WL includes a plurality of insulating layers 102 and a plurality of conductive layers 126, for example, including 128 insulating layers 102 and 128 conductive layers 126, but the disclosure is not limited thereto. In other embodiments, the upper portion of the stack structure SK2 serving as the string selection lines SSL may include a plurality of insulating layers 102 and a plurality of conductive layers 126, for example, including three insulating layers 102 and three conductive layers 126, but the disclosure is not limited thereto.

Figure 2B:
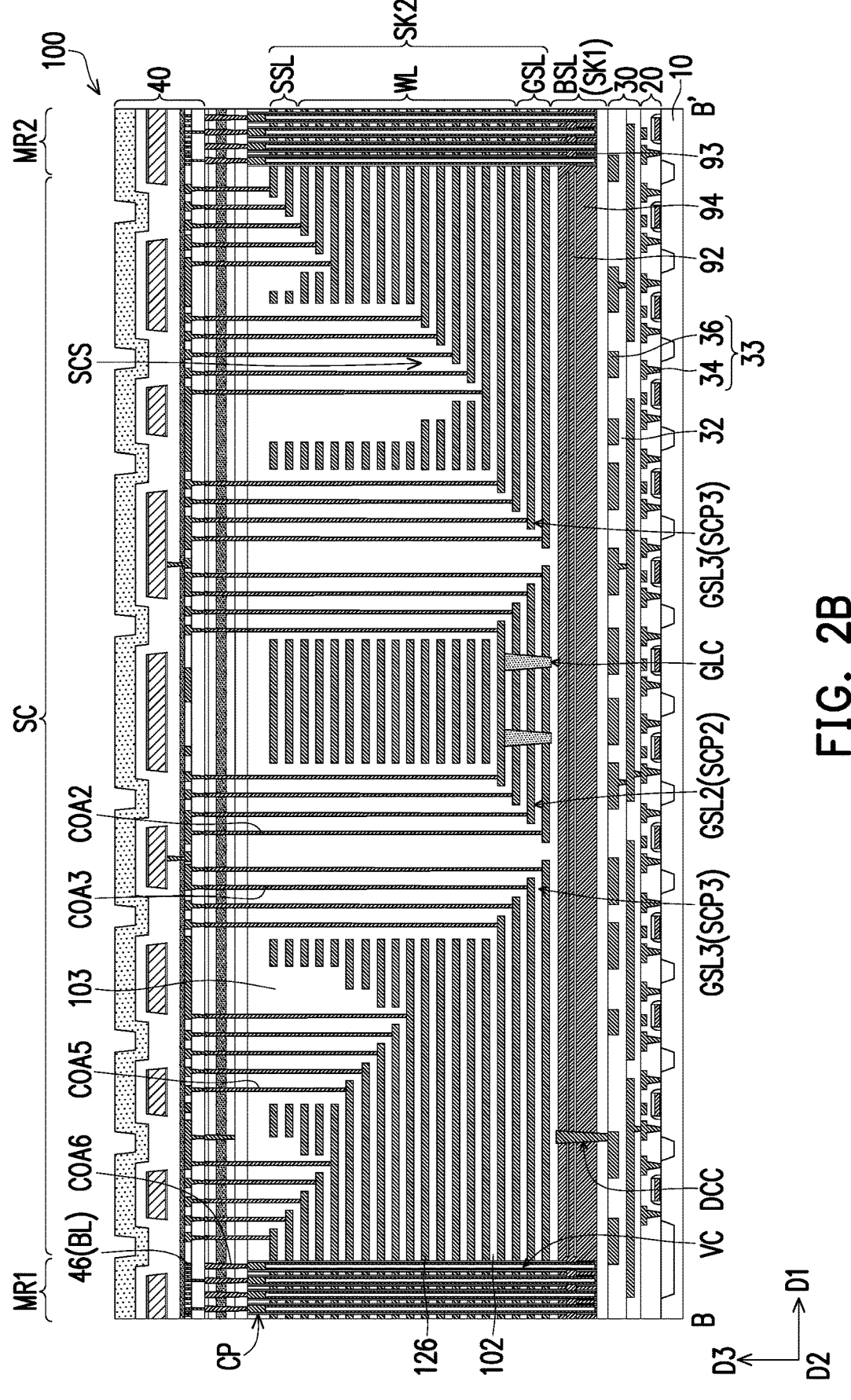
Figure 2C:
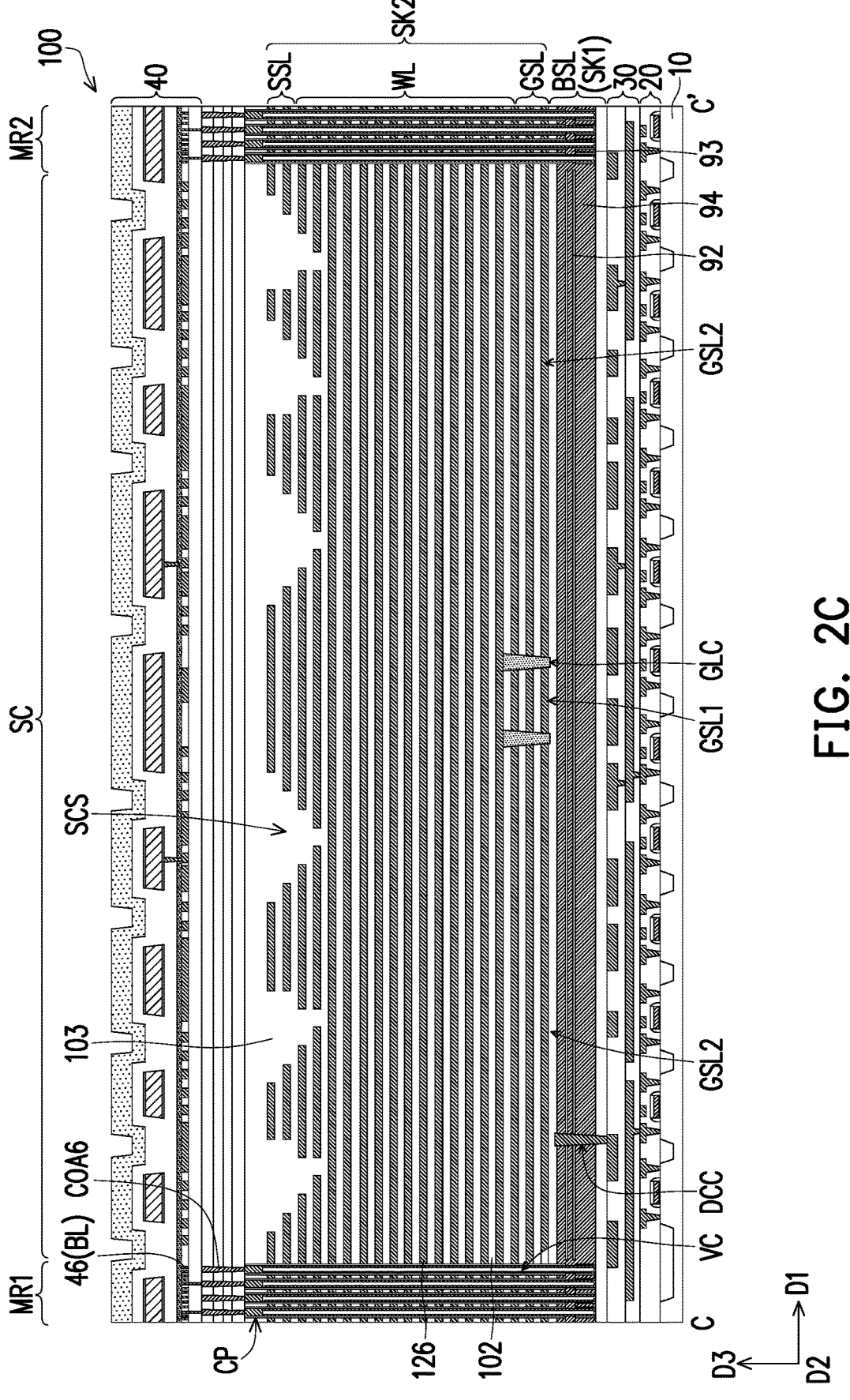

Referring to FIG. 1B, in an embodiment of the disclosure, a plurality of blocks B are defined by a plurality of second slits SLIT2. The second slits SLIT2 are located at one side of the first block B1, between the first block B1 and the second block B2, and at one side of the second block B2. Each second slit SLIT2 extends continuously from the first memory array area MR1 to the second memory array area MR2 along the direction D1, and the plurality of second slits SLIT2 are arranged in the direction D2. Referring to FIG. 2E, each second slit SLIT2 extends continuously from the upper portion to the lower portion of the stack structure SK2. In some embodiments, the second slit SLIT2 is an insulating material, such as silicon oxide. In other embodiments, in addition to an insulating material, the second slit SLIT2 further includes a conductive material covered by the insulating material. The conductive material is, for example, polysilicon or tungsten.

Referring to FIG. 1A and FIG. 1B, in an embodiment of the disclosure, a plurality of global selection line structures GSL are defined in each block B by a plurality of bottom slits GLC, a plurality of first slits SLIT1, and the plurality of second slits SLIT2 embedded in the stack structure SK2. In some embodiments, the first slit SLIT1 is an insulating material, such as silicon oxide. In other embodiments, in addition to an insulating material, the first slit SLIT1 further includes a conductive material covered by the insulating material. The conductive material is, for example, polysilicon or tungsten. In an embodiment of the disclosure, the plurality of global selection line structures GSL in each block B include a first global selection line structure GSL1, a second global selection line structure GSL2, a third global selection line structure GSL3, and a fourth global selection line structure GSL4.

Referring to FIG. 1A and FIG. 1B, each block B has a plurality of bottom slits GLC. In an embodiment of the disclosure, each block B has two first bottom slits GLC1 and two second bottom slits GLC2. Each first bottom slit GLC1 extends continuously in the direction D1 between the first region R1 and the second region R2, then extends continuously in the direction D2 through the second region R2 and the third region R3, and then extends continuously in the direction D1 between the third region R3 and the fourth region R4. Each first bottom slit GLC1 is, for example, a rotated U-shape. The bottoms of the U-shapes of the two first bottom slits GLC1 in each block B are disposed opposite to each other and are separated from each other by a non-zero distance. The second bottom slit GLC2 is located within the corresponding first bottom slit GLC1. Referring to FIG. 2G to FIG. 2J, each first bottom slit GLC1 is embedded in the lower portion of the stack structure SK2. Each second bottom slit GLC2 is also embedded in the lower portion of the stack structure SK2 (not shown). The first bottom slit GLC1 and the second bottom slit GLC2 are insulating materials, such as silicon oxide, SiN, SiON, SiC, SiCN, $Al_2O_3$, or high dielectric constant materials.

Referring to FIG. 1B, each block B has the first slit SLIT1. The first slit SLIT1 extends discontinuously in the direction D1 between the second region R2 and the third region R3. The first slit SLIT1 includes a plurality of first segments S1, a plurality of second segments S2, and a plurality of third segments S3. The second segment S2 is located between and separated from the first segment S1 and the third segment S3. The first segment S1 and the second segment S2 are located within a range surrounded by the corresponding first bottom slit GLC1, and are spaced apart from the first bottom slit GLC1 by a non-zero distance. The plurality of third segments S3 are connected to the first bottom slit GLC1. The second bottom slit GLC2 is connected to the first segment S1 and the second segment S2 of the first slit SLIT1 within the corresponding first bottom slit GLC1. Referring to FIG. 2E, the first slit SLIT1 extends continuously from the upper portion to the lower portion of the stack structure SK2, and further extends into the stack structure SK1.

Figure 1C:
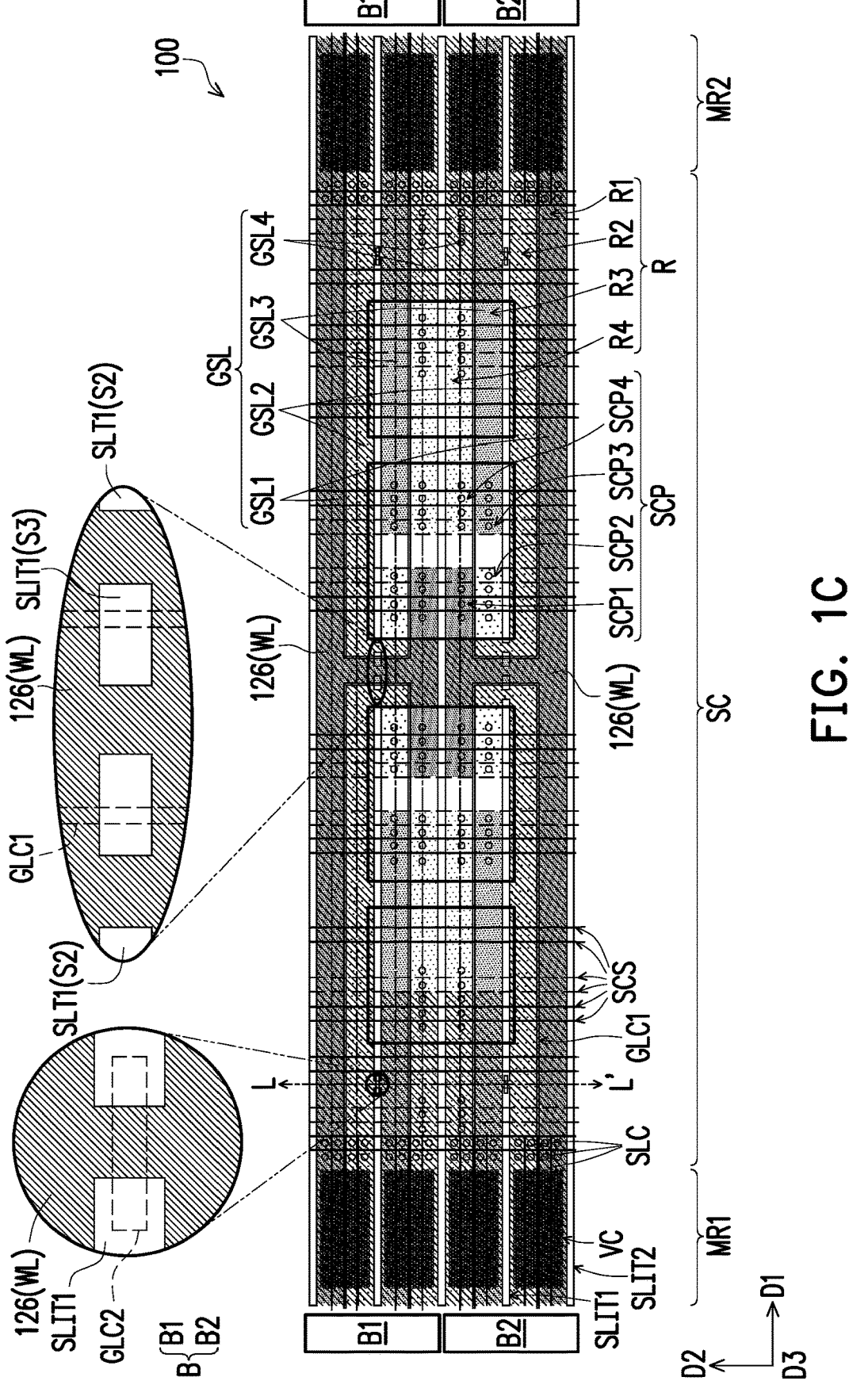
FIG. 1C is a top view of a word line of a semiconductor device according to an embodiment of the disclosure.
Figure 1D:
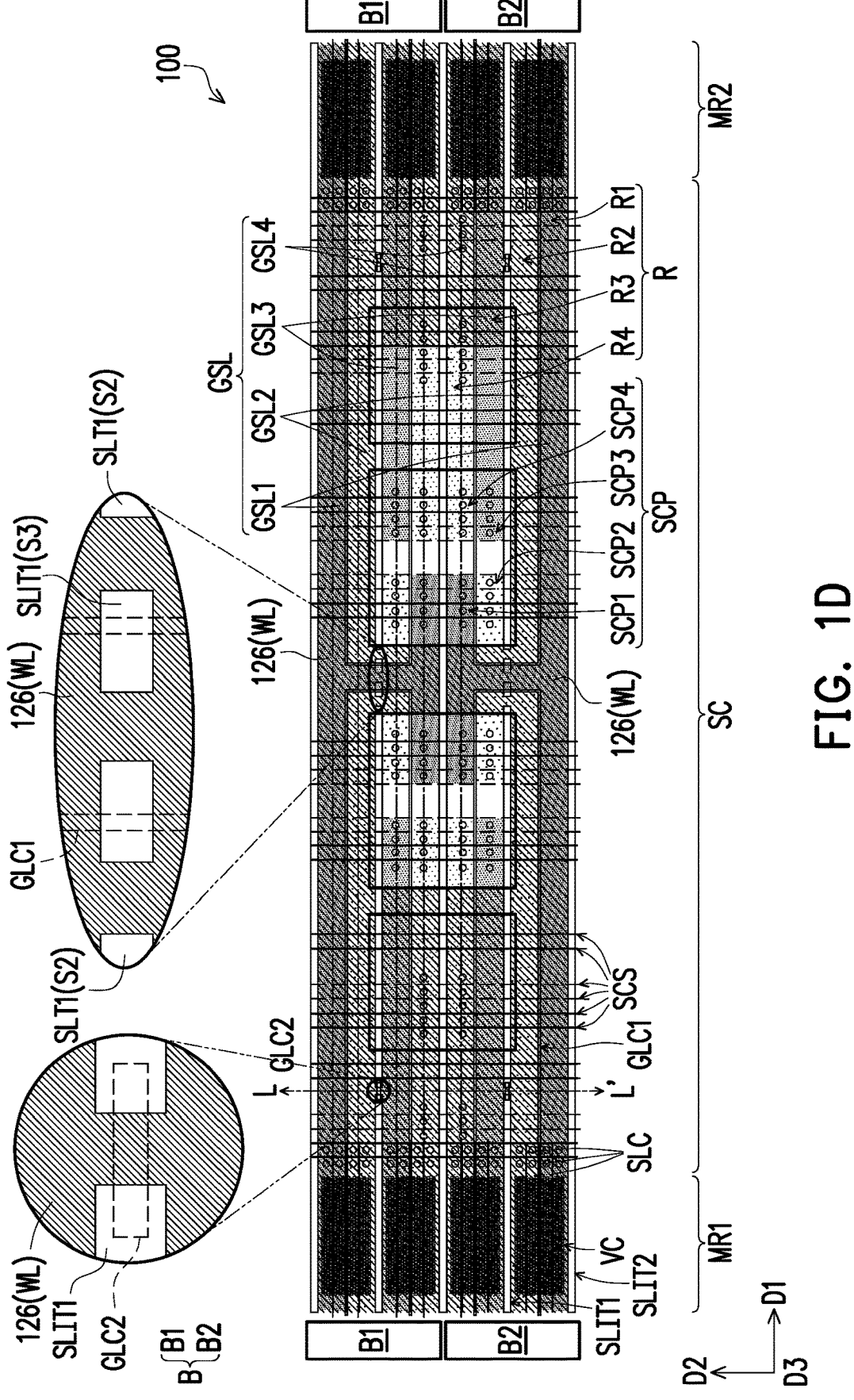
FIG. 1D is a top view of another word line of a semiconductor device according to an embodiment of the disclosure.

FIG. 1C is a top view of a word line of a semiconductor device according to an embodiment of the disclosure. FIG. 1D is a top view of another word line of a semiconductor device according to an embodiment of the disclosure.

Referring to FIGS. 1C, 1D, 2K and 2L, the word line WL in the block B1 and the block B2 are partially separated and electrically isolated by the second slit SLIT2, but are integrated respectively. The word line WL in the first region R1 and the second region R2 of the block B1 (or the block B2) each pass through the staircase structure area SC from the first memory array area MR1 extending continuously to the second memory array area MR2 and connects to each other above the first bottom slit GLC1. The word line WL in the third region R3 and the fourth region R4 of the block B1 (or the block B2) and the word line WL in of the block B1 (or the block B2) each pass through a first portion of the staircase structure area SC from the first memory array area MR1 and pass through a second portion of the staircase structure area SC from the second memory array area MR2 and connects to each other above the first bottom slit GLC1.

The word line WL is also located above the second bottom slit GLC2, and pass through the first slit SLIT1 to electrically connect the word line WL in the second region R2 and the third region R3, so that the word line WL in the first region R1, the second region R2, the third region R3 and the fourth region R4 is continuous and integrated.

Figure 4A:
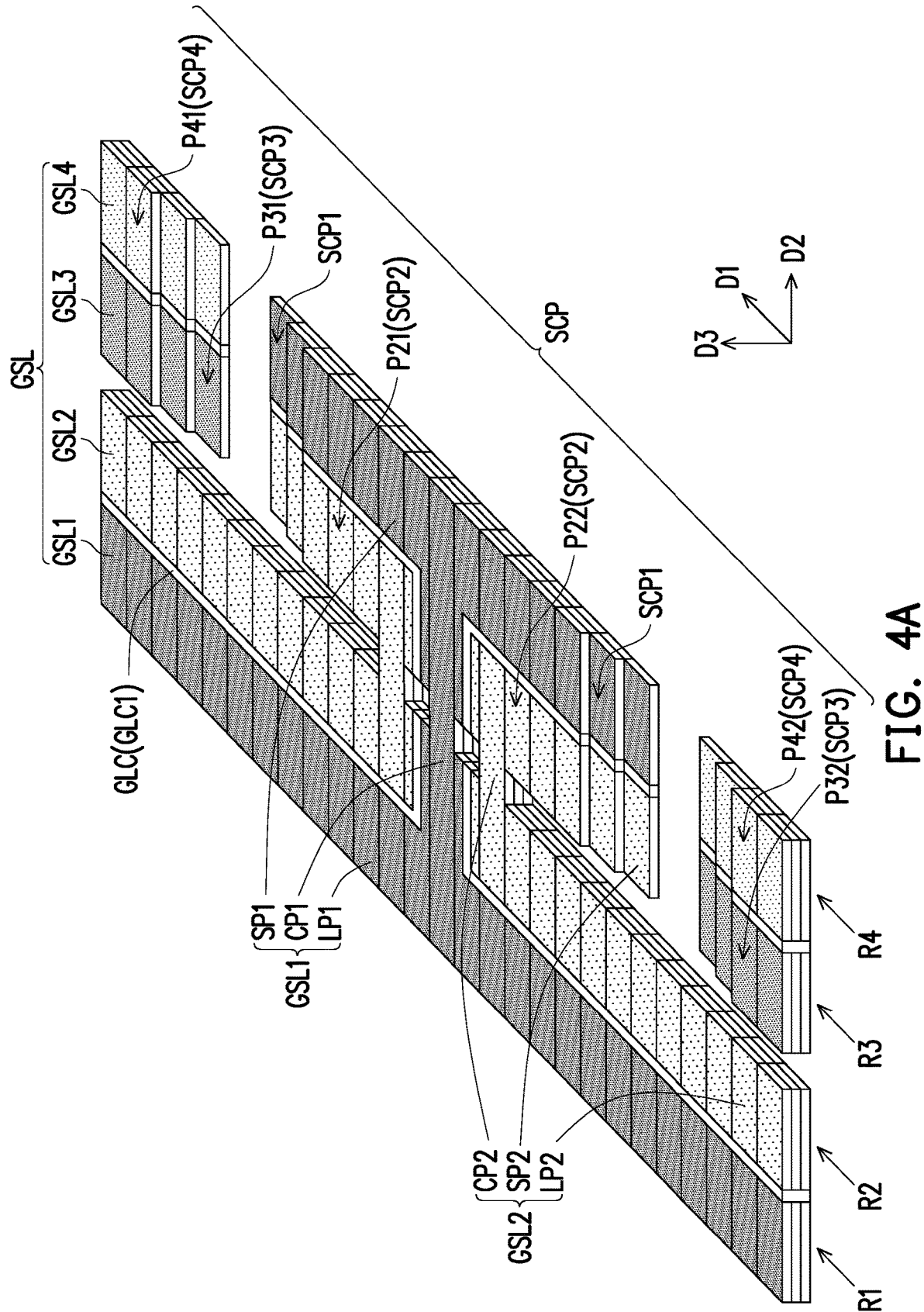
FIG. 4A is a perspective view of a plurality of global selection line structures according to an embodiment of the disclosure.
Figure 4B:
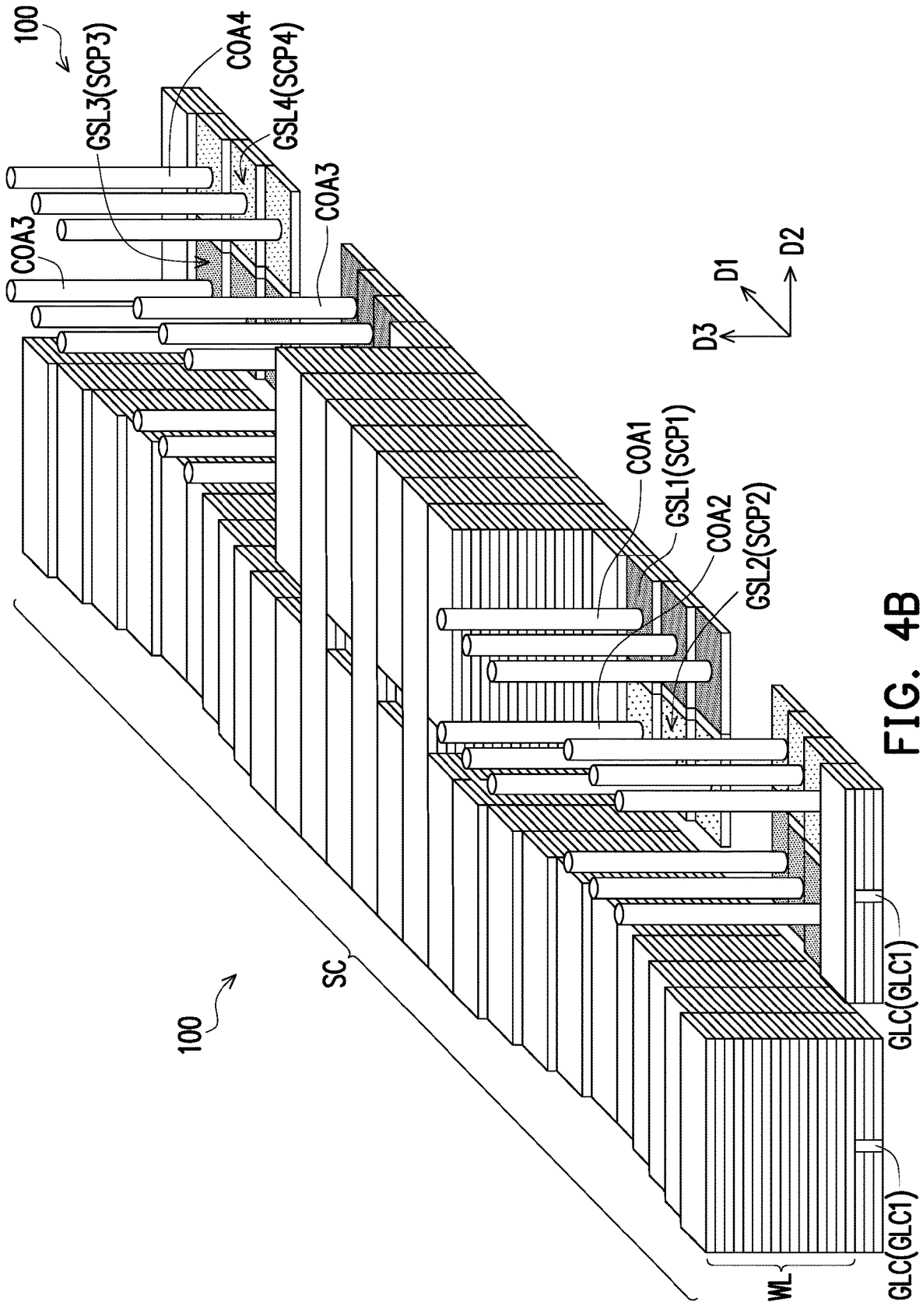
FIG. 4B is a perspective view of a plurality of global selection line structures and word lines above them according to an embodiment of the disclosure.
Figure 4C:
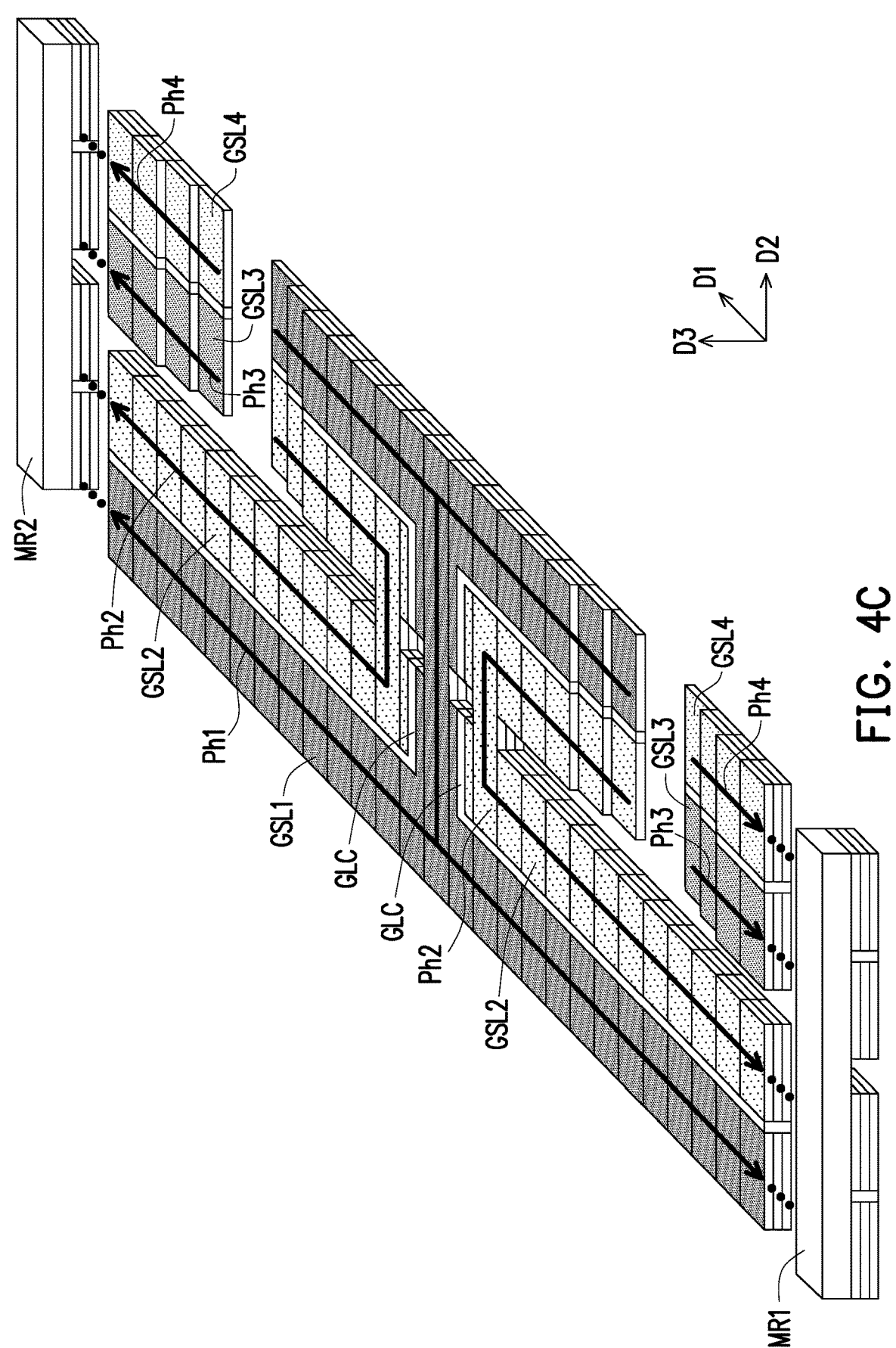
FIG. 4C is a perspective view of a plurality of global selection line structures and their current paths according to an embodiment of the disclosure.

FIG. 4A is a perspective view of a plurality of global selection line structures according to an embodiment of the disclosure. FIG. 4B is a perspective view of a plurality of global selection line structures and word lines above them according to an embodiment of the disclosure. FIG. 4C is a perspective view of a plurality of global selection line structures and their current paths according to an embodiment of the disclosure.

Figure 2D:
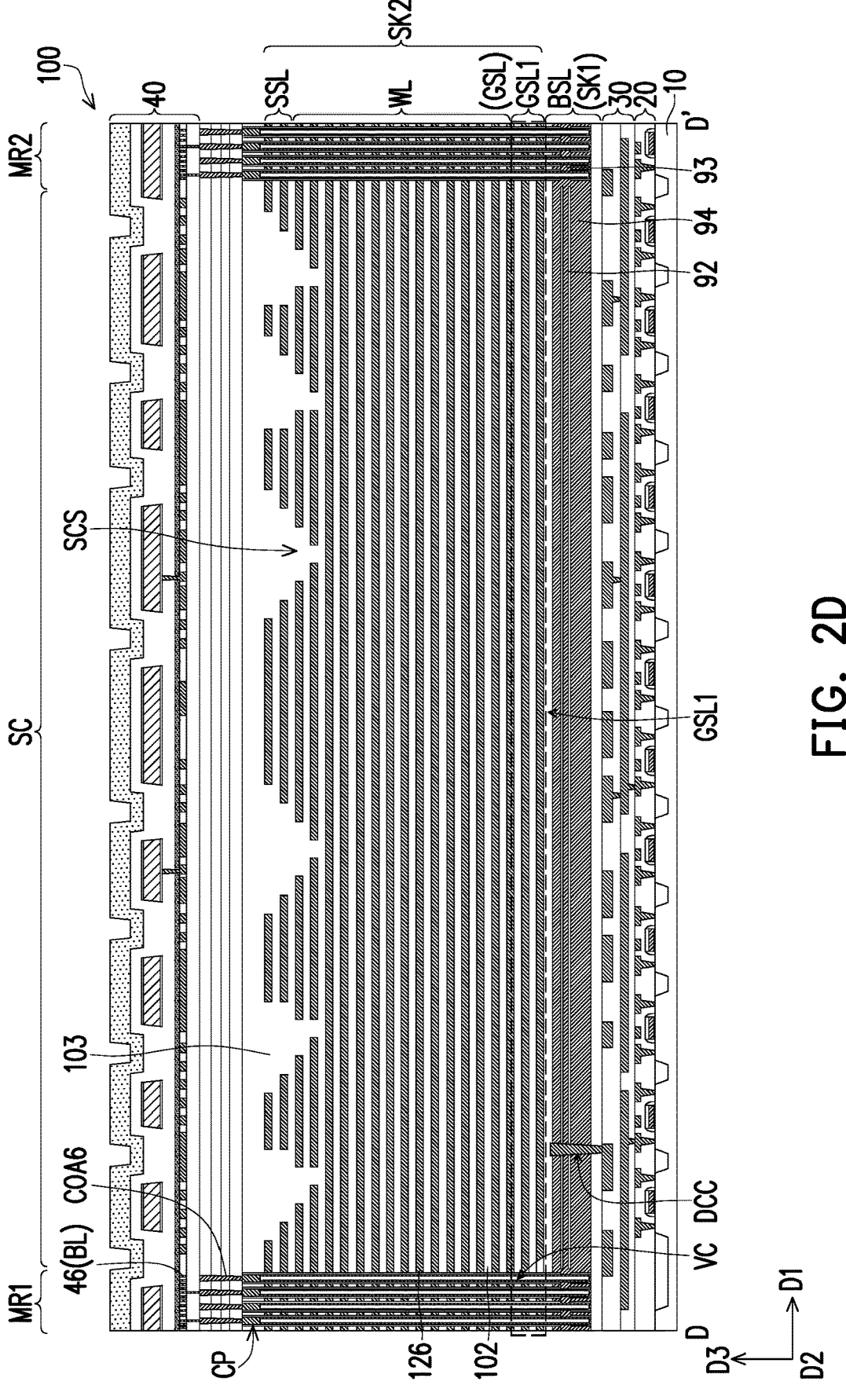
Figure 2E:
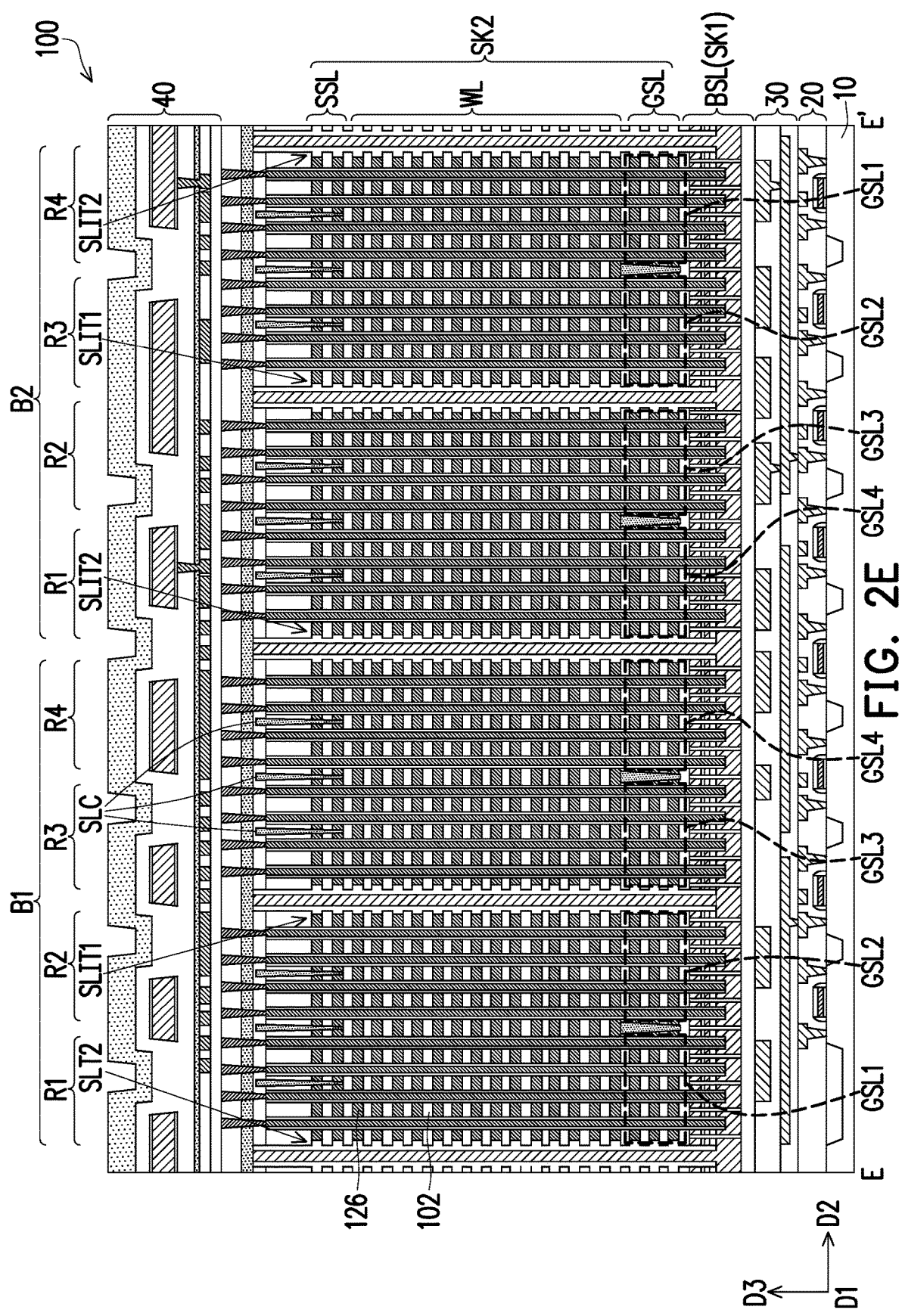
Figure 2F:
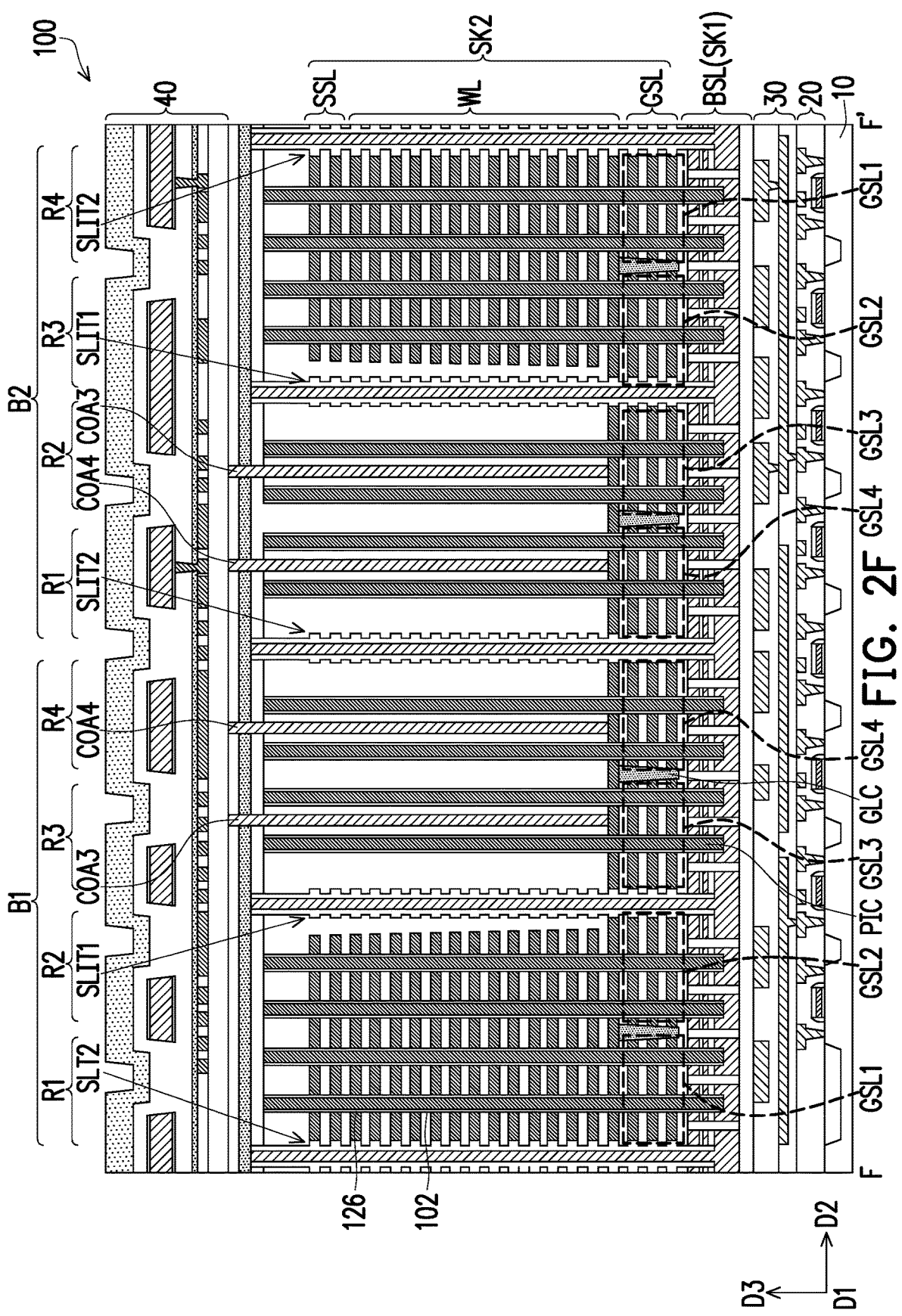
Figure 2G:
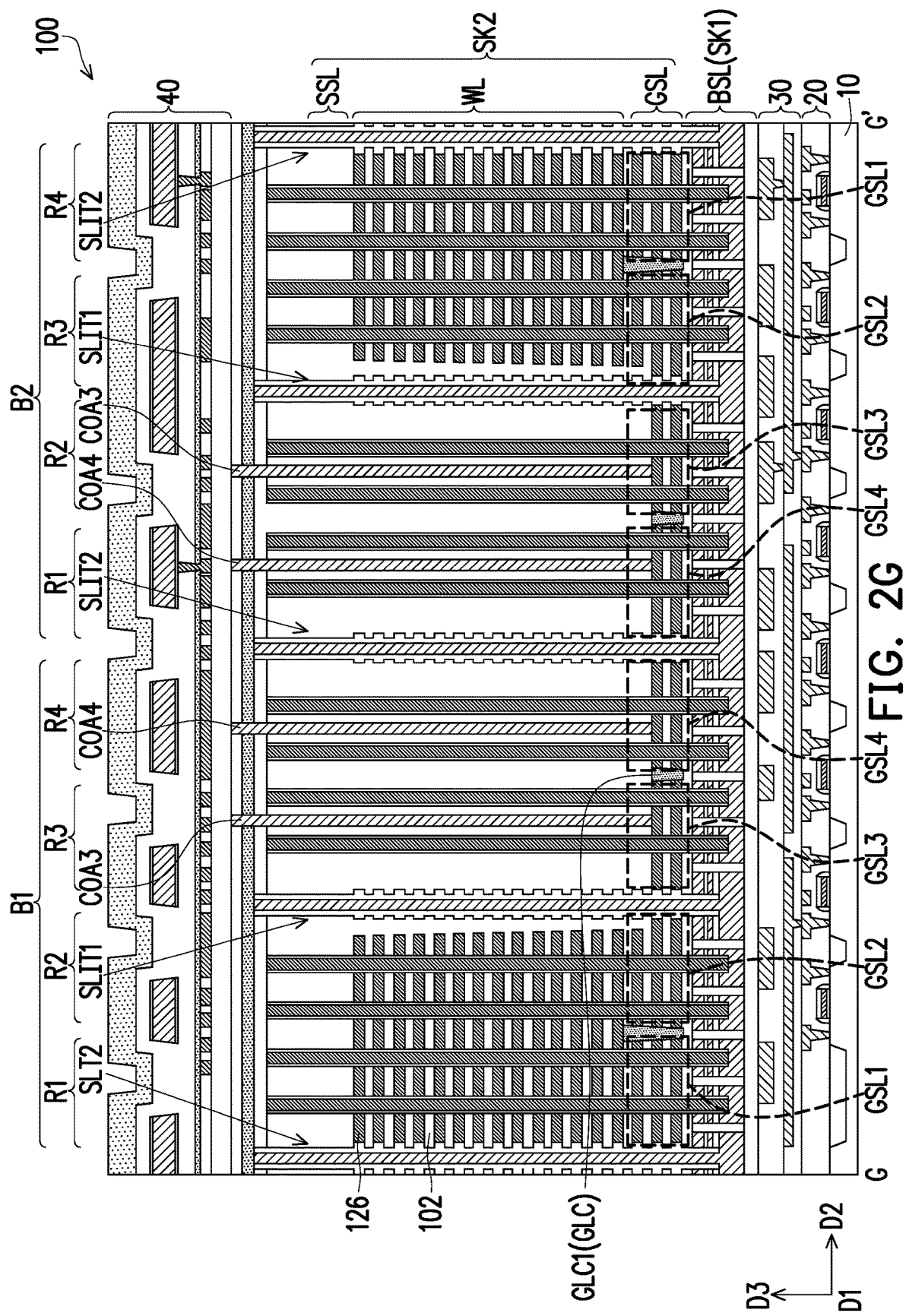
Figure 2H:
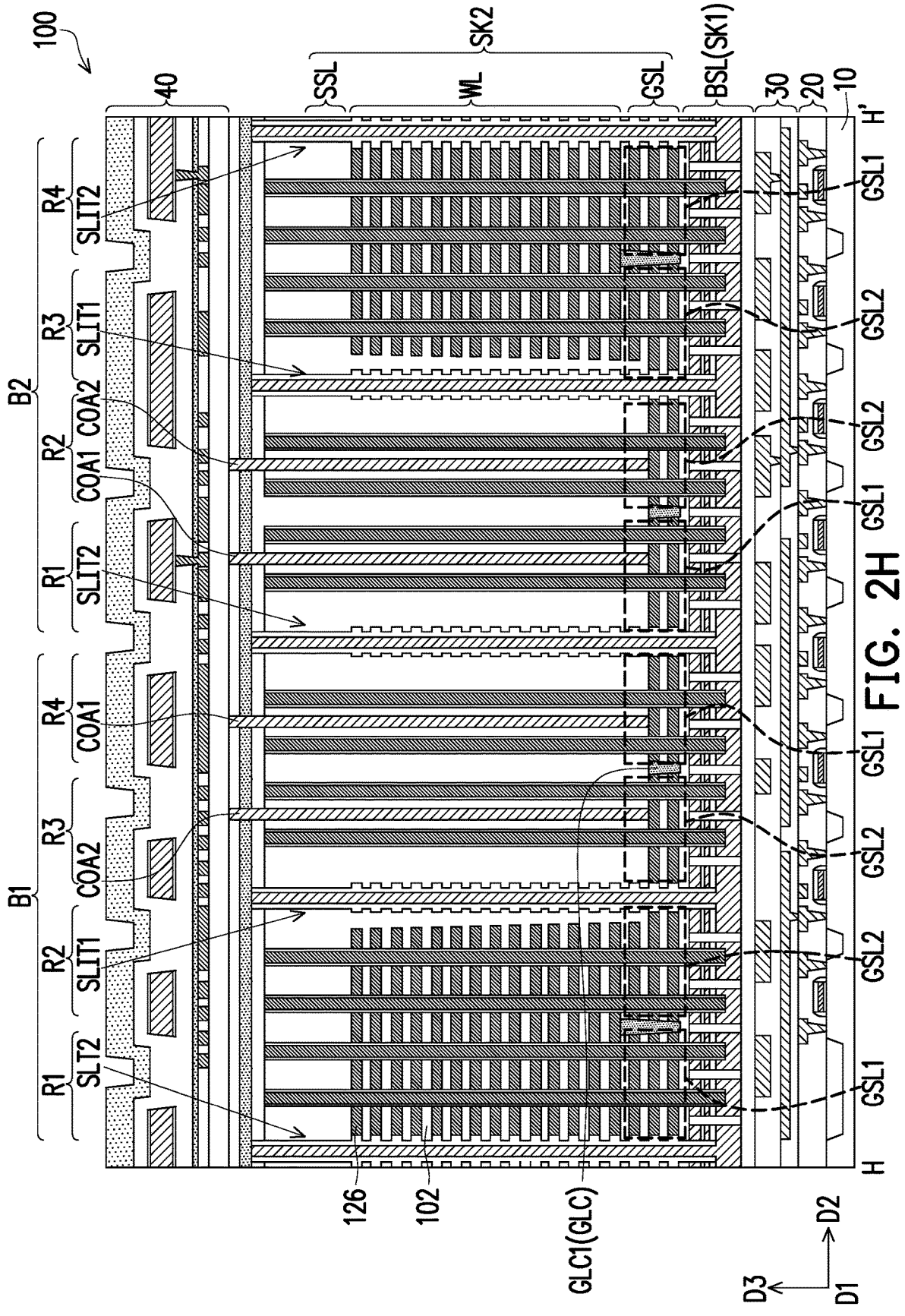
Figure 2I:
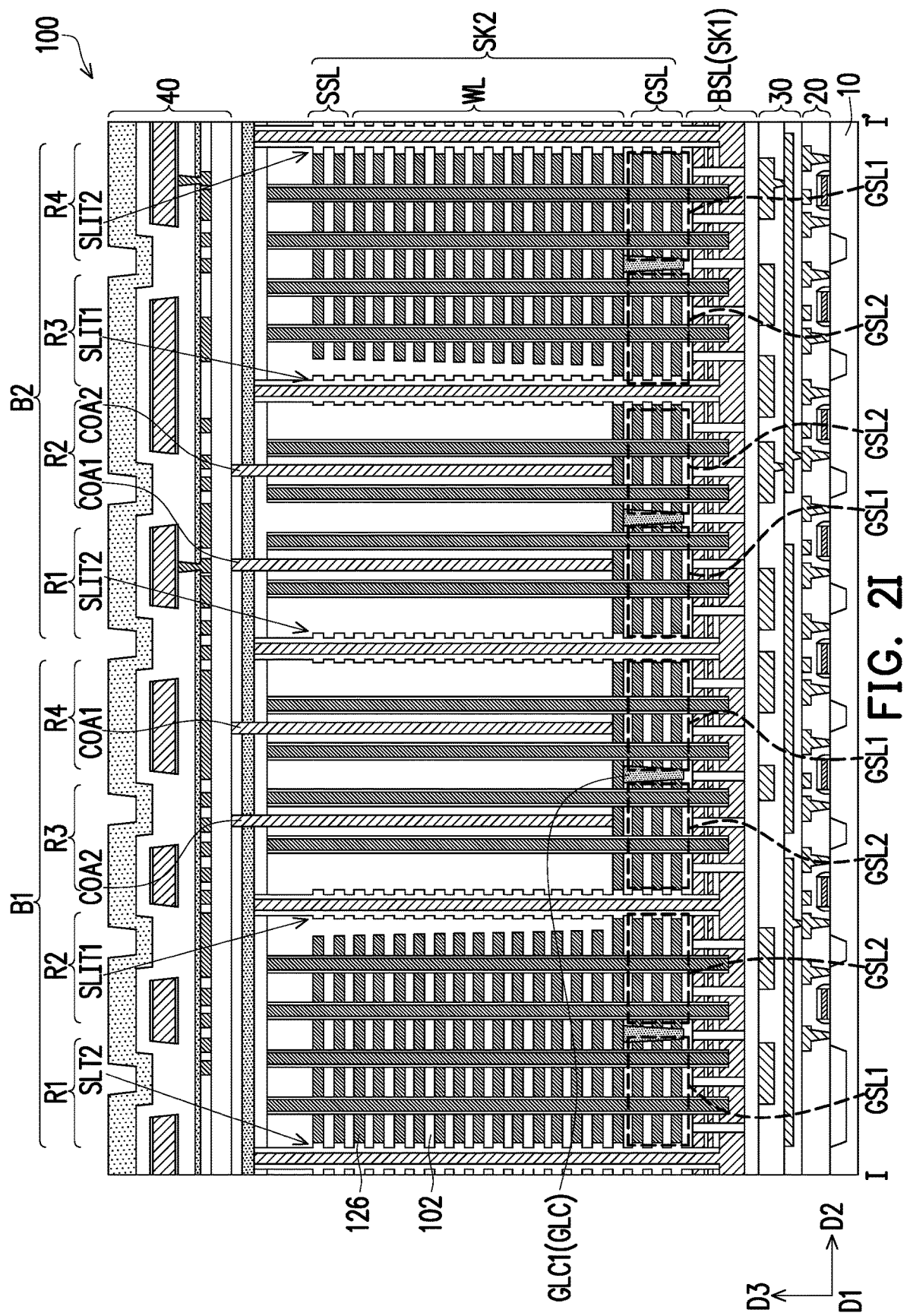
Figure 2J:
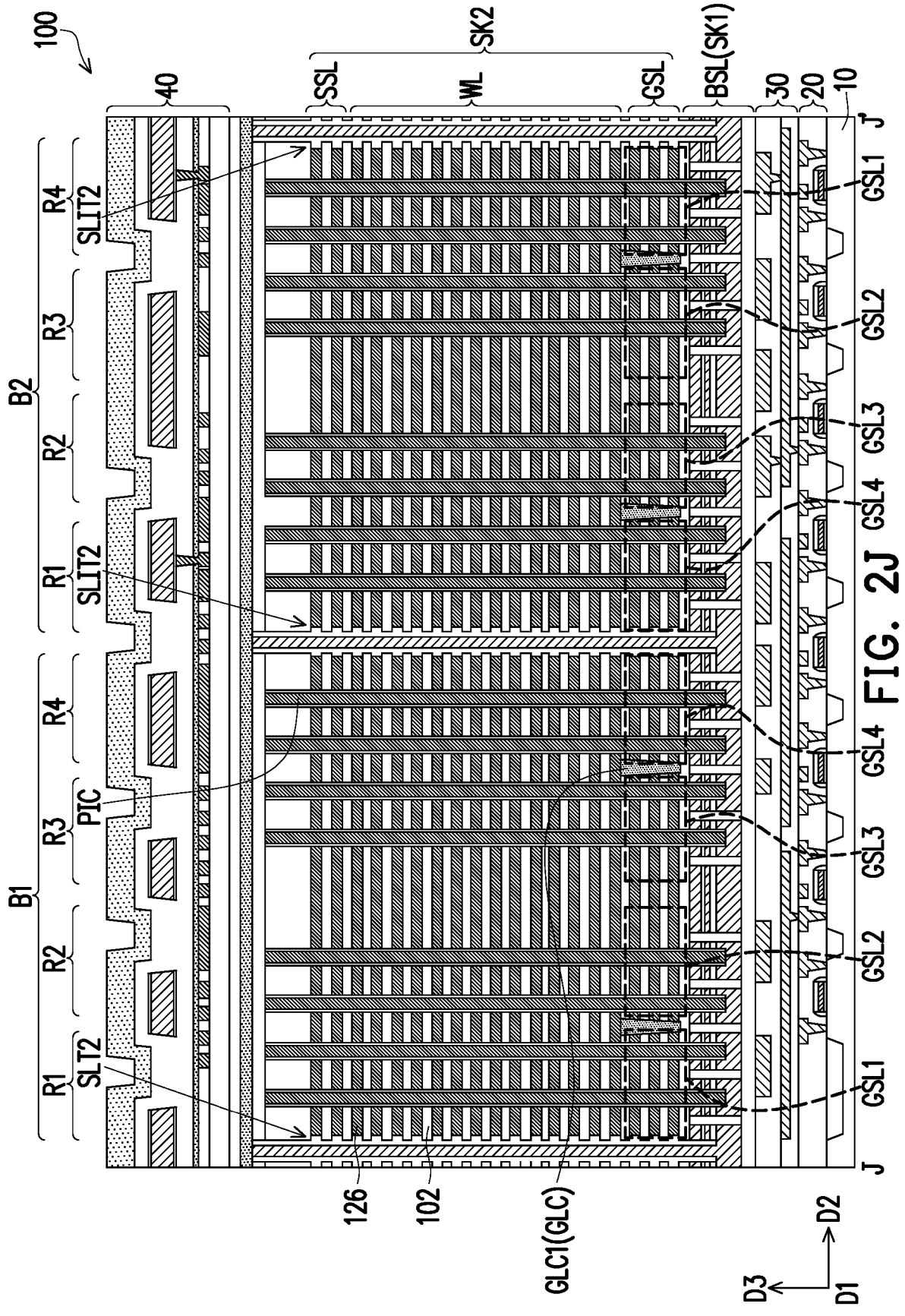

Referring to FIG. 2D, the first global selection line structure GSL1 extends continuously from the first memory array area MR1 to the second memory array area MR2 through the plurality of staircase structure area SC. Referring to FIG. 4A, viewed from the above, the first global selection line structure GSL1 is, for example, a deformed H-shape composed of two T-shapes having different sizes. The first global selection line structure GSL1 includes a first long strip LP1, a first short strip SP1, and a first connection part CP1. The first long strip LP1 and the first short strip SP1 extend in the direction D1, and the first connection part CP1 extends in the direction D2 different from the direction D1.

Figure 2K:
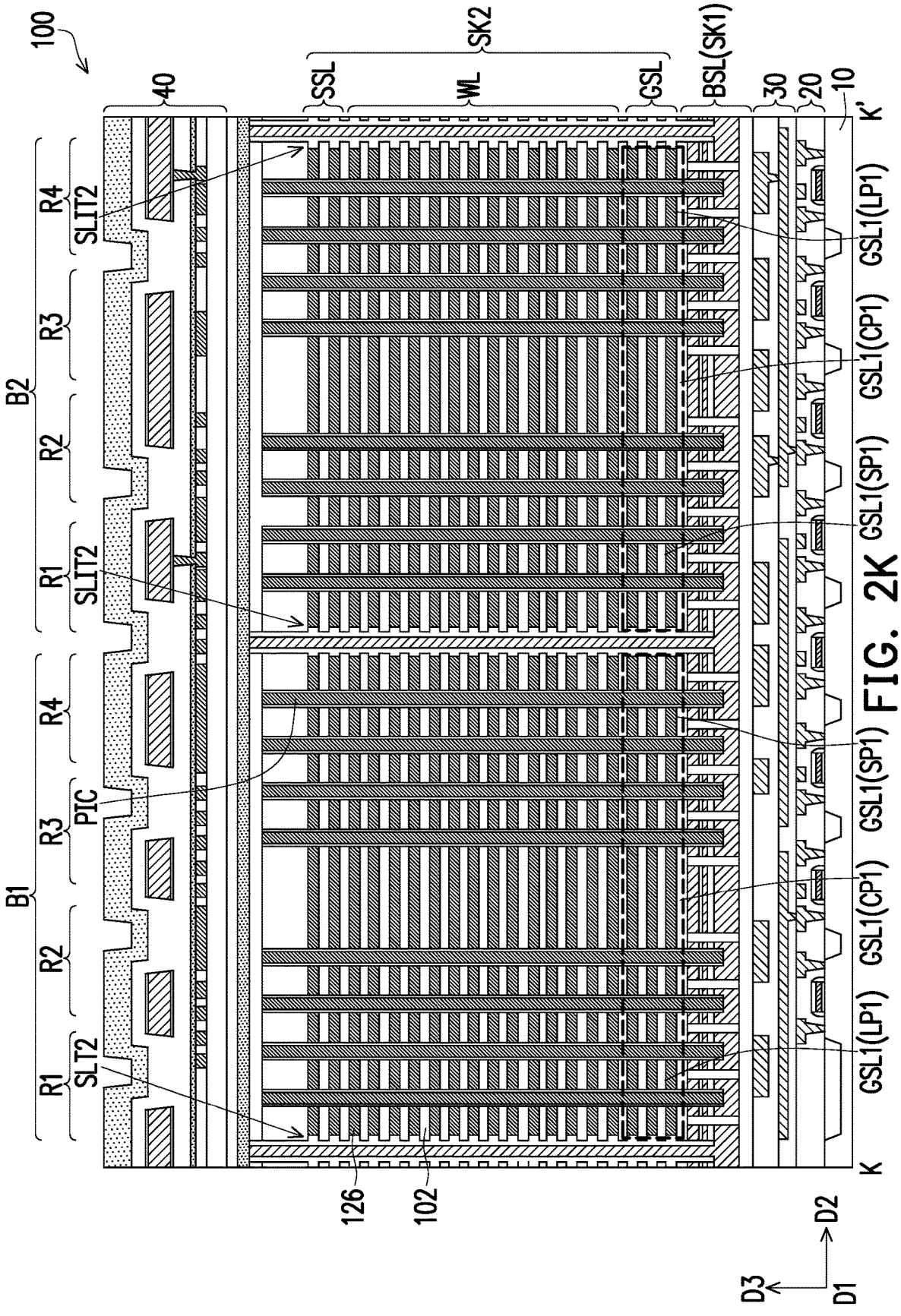
Figure 2L:
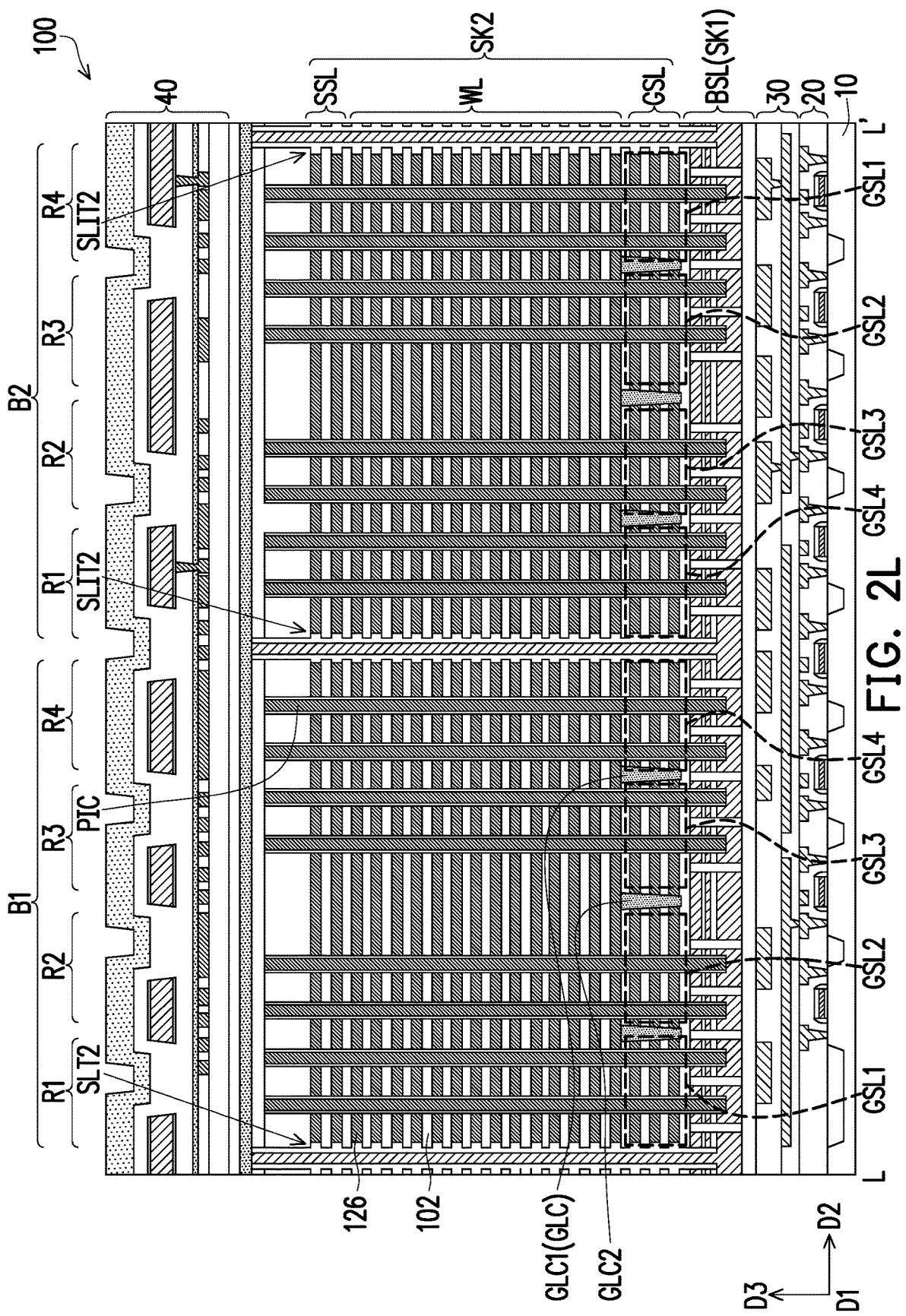

Referring to FIG. 4A, FIG. 4C, and FIG. 2E, the first long strip LP1 is disposed below the plurality of word lines WL in the first region R1 and passes through the staircase structure area SC from the first memory array area MR1 extending continuously to the second memory array area MR2. Referring to FIG. 4A, FIG. 4C, and FIG. 2A, the first short strip SP1 is continuously disposed below the plurality of word lines WL in the staircase structure area SC in the fourth region R4. Referring to FIG. 4A, FIG. 4C, and FIG. 2K, the first connection part CP1 is continuously disposed below the plurality of word lines WL in the staircase structure area SC in the second region R2 and the third region R3, connects the first long strip LP1 and the first short strip SP1. The first connection part CP1 extends continuously across the second region R2 and the third region R3.

Referring to FIG. 4A and FIG. 4C, the second global selection line structure GSL2 is adjacent to the first global selection line structure GSL1 and is divided into portions P21 and P22 which are separated from each other. In the embodiment of the disclosure, the portions P21 and P22 of the second global selection line structure GSL2 are, for example, rotated J-shapes, respectively. The portions P21 and P22 of the second global selection line structure GSL2 each include a second long strip LP2, a second short strip SP2, and a second connection part CP2. The second long strip LP2 and the second short strip SP2 extend in the direction D1, and the second connection part CP2 extends in the direction D2 different from the direction D1.

The second long strip LP2 is disposed in the second region R2, and is adjacent to the first long strip LP1. The second long strip LP2 of the portions P21 of the second global selection line structure GSL2 is continuously disposed below the plurality of word lines WL from the first memory array area MR1 to the staircase structure area SC in the second region R2. The second long strip LP2 of the portions P22 of the second global selection line structure GSL2 is continuously disposed below the plurality of word lines WL from the second memory array area MR2 to the staircase structure area SC in the second region R2.

The second short strips SP2 of the portions P21 and the portions P22 of the second global selection line structure GSL2 are disposed below the plurality of word lines WL in the staircase structure area SC in the third region R3, and is adjacent to the first short strip SP1.

The second connection parts CP2 of the portions P21 and the portions P22 of the second global selection line structure GSL2 are disposed below the plurality of word lines WL in the staircase structure area SC in the second region R2 and the third region R3, connects the second long strip LP2 and the second short strip SP2. The second connection part CP2 is adjacent to the first connection part CP1.

Referring to FIG. 4A, the third global selection line structure GSL3 is disposed in the third region R3, and is divided into two portions P31 and P32 by the first connection part CP1 of the first global selection line structure GSL1 and the second short strip SP2 and the second connection part CP2 of the second global selection line structure GSL2. The portions P31 of the third global selection line structure GSL3 extends in the direction D1 and disposed continuously below the plurality of word lines WL from the first memory array area MR1 to the staircase structure area SC. The portions P32 of the third global selection line structure GSL3 extends in the direction D1 and disposed continuously below the plurality of word lines WL from the second memory array area MR2 to staircase structure area SC. In one example, the portion P31 of the third global selection line structure GSL3 is disposed opposite to the second short strip SP2 of the portions P21 of the second global selection line structure GSL2 separated by a distance in the third region R3. Likewise, the portion P32 of the third global selection line structure GSL3 is disposed opposite to the second short strip SP2 of the portions P22 of the second global selection line structure GSL2 separated by a distance in the third region R3.

The fourth global selection line structure GSL4 is disposed in the fourth region R4, and is divided into two portions P41 and P42 by the first short strip SP1 of the first global selection line structure GSL1. The portion P41 of the fourth global selection line structure GSL4 extends in the direction (D1) and disposed continuously below the plurality of word lines WL from the first memory array area MR1 to of staircase structure area SC. The portion P42 of the fourth global selection line structure GSL4 extends in the direction (D1) and disposed continuously below the plurality of word lines WL from the second memory array area MR2 to the staircase structure area SC. In one example, the portion P41 of the fourth global selection line structure GSL4 is disposed opposite to the first short strip SP1 of the first global selection line structure GSL1 separated by a distance in the fourth region R4. Likewise, the portion P42 of the fourth global selection line structure GSL4 is disposed opposite to the first short strip SP1 of the first global selection line structure GSL1 separated by a distance in the fourth region R4.

Referring to FIG. 1B and FIG. 4A, the plurality of first bottom slits GLC1 separate the first long strip LP1, the first connection part CP1, and the first short strip SP1 of the first global selection line structure GSL1 from the second long strip LP2, the second connection part CP2, and the second short strip SP2 of the second global selection line structure GSL2. Also, the plurality of first bottom slits GLC1 separate the third global selection line structure GSL3 from the fourth global selection line structure GSL4.

Referring to FIG. 1B, the first segment S1 and the second segment S2 of the first slit SLIT1 are connected to the second bottom slit GLC2, and separate the second long strip LP2 of the second global selection line structure GSL2 from the third global selection line structure GSL3. The plurality of third segments S3 of the first slit SLIT1 are adjacent to and separated from each other. The plurality of third segments S3 of the first slit SLIT1 are connected to the first bottom slit GSL1 located between the first connection part CP1 of the first global selection line structure GSL1 and the second connection part CP2 of the second global selection line structure GSL2.

Referring to FIGS. 1B, 1C, 1D, 2A, 2B, 2C, 2D, 2J to 2L, according to the above description, the word line WL in the block B1 and the block B2 are respectively integrated and separated and electrically isolated by the second slit SLIT2. In other words, the word line WL is continuous and integrated over the first long strip LP1 and the first short strip SP1 of the first global selection line structure GSL1, and over the first connection part CP1 of the first global selection line structure GSL1 extending through the first slit SLIT1.

The word line WL is continuous and integrated over the second long strip LP2 and the second short strip SP2 of the two portion P21 or P22 of the second global selection line structure GSL2, and over the second connection part CP2 of the two portion P21 or P22 of the second global selection line structure GSL2 extending through the first slit SLIT1.

The word line WL is continuous and integrated over the two portions P31 or P32 of the third global selection line structure GSL3. The word line WL is continuous and integrated over the two portions P41 or P42 of the fourth global selection line structure GSL4.

Referring to FIGS. 1C and 1D, the word line WL further straddles a portion of the first bottom slit GLC1 and the second bottom slit GLC2. Therefore, the word line WL is continuous and integrated over the first global selection line structure GSL1, the second global selection line structure GSL2, the third global selection line structure GSL3, and the fourth global selection line structure GSL4.

Referring to FIG. 4A, each global selection line structure GSL has a staircase part SCP. The first short strip SP1 of the first global selection line structure GSL1 has a plurality of first staircase parts SCP1. Each second short strip SP2 of the second global selection line structure GSL2 has a second staircase part SCP2. The portions P31 and P32 of the third global selection line structure GSL3 has a corresponding third staircase part SCP3. The portions P41 and P42 of the fourth global selection line structure GSL4 has a corresponding fourth staircase part SCP4.

Referring to FIG. 4A, the third staircase part SCP3 and the fourth staircase part SCP4 are respectively disposed in the third region R3 and the fourth region R4. The first staircase part SCP1 and the second staircase part SCP2 are not respectively disposed in the first region R1 and the second region R2, but are respectively disposed in the fourth region R4 and the third region R3. The first staircase part SCP1 is disposed opposite to the fourth staircase part SCP4 in the fourth region R4. The second staircase part SCP2 is disposed opposite to the third staircase part SCP3 in the third region R3. In some embodiments, the first staircase part SCP1 is symmetrical with the fourth staircase part SCP4, and the second staircase part SCP2 is symmetrical with the third staircase part SCP3.

Referring to FIG. 2A and FIG. 2B, a dielectric layer 103 covers the plurality of staircase structures SCS, and further separates the first staircase part SCP1 and the fourth staircase part SCP4 (as shown in FIG. 2A), and separates the second staircase part SCP2 and the third staircase part SCP3 (as shown in FIG. 2B). The dielectric layer 103 may be one layer or multiple layers. The dielectric layer 103 includes silicon oxide, silicon nitride, silicon oxynitride, or a combination thereof.

Referring to FIG. 2A and FIG. 4B, a plurality of first contacts COA1 land on the first staircase part SCP1 and are electrically connected to the first global selection line structure GSL1. Referring to FIG. 2B and FIG. 4B, a plurality of second contacts COA2 land on the second staircase part SCP2 and are electrically connected to the second global selection line structure GSL2. Referring to FIG. 2B and FIG. 4B, a plurality of third contacts COA3 land on the third staircase part SCP3 and are electrically connected to the third global selection line structure GSL3. Referring to FIG. 2A and FIG. 4B, a plurality of fourth contacts COA4 land on the fourth staircase part SCP4 and are electrically connected to the fourth global selection line structure GSL4. Referring to FIG. 2A, a plurality of fifth contacts COA5 land on and are electrically connected to the plurality of word line WL of the staircase structure SCS. A plurality of sixth contacts COA6 land on a vertical channel pillar CP.

Referring to FIG. 4B and FIG. 4C, after a current flows into the first global selection line structure GSL1 from the first contact COA1, the current flows to the first memory array area MR1 and the second memory array area MR2 along a current path Ph1. After a current flows into the second global selection line structure GSL2 from the second contact COA2, the current flows to the first memory array area MR1 and the second memory array area MR2 along a current path Ph2. After a current flows into the third global selection line structure GSL3 from the third contact COA3, the current flows to the first memory array area MR1 and the second memory array area MR2 along a current path Ph3. After a current flows into the fourth global selection line structure GSL4 from the fourth contact COA4, the current flows to the first memory array area MR1 and the second memory array area MR2 along a current path Ph4.

Referring to FIG. 2A, a first memory array and a second memory array are formed in the middle portion of the stack structure SK2 in the first memory array area MR1 and the second memory array area MR2. Each of the first memory array and the second memory array includes a plurality of word lines WL, a plurality of vertical channel pillars CP, and a charge storage structure 108 surrounding each of the plurality of vertical channel pillars CP to form a plurality of memory cells arranged in three dimensions. The vertical channel pillar CP includes a channel layer 110, an insulating pillar 112, and a conductive plug 114. The material of the channel layer 110 includes polysilicon. The material of the conductive plug 114 includes polysilicon. The material of the insulating pillar 112 includes silicon oxide. The charge storage structure 108 surrounds the vertical outer surface of the vertical channel pillar CP. The charge storage structure 108 is an oxide/nitride/oxide (ONO) composite layer.

Referring to FIG. 3, in some embodiments, the semiconductor device 100 further includes a support structure PIC to prevent the staircase structure SCS from collapsing in the fabrication process. The support structure PIC may have a structure different from a combined structure of the charge storage structure 108 and the vertical channel pillar CP, but the disclosure is not limited thereto. In other embodiments, the support structure PIC may have the same structure as a combined structure of the charge storage structure 108 and the vertical channel pillar CP.

Referring to FIG. 2A, the semiconductor device 100 further includes a metal interconnect structure 40. The metal interconnect structure 40 is located above the stack structure SK2. The metal interconnect structure 40 may include a plurality of dielectric layers 42, a plurality of plugs 44, a plurality of conductive lines 46, etc. The dielectric layers 42 separate the conductive line 46 from the vertical channel pillar CP and adjacent conductive lines 46. The conductive lines 46 may be connected to each other by the plugs 44, and the conductive lines 46 may be respectively electrically connected to the contacts COAL to COA6 (as shown in FIG. 2A and FIG. 2B). The conductive line 46 connected to the contact COA6 may serve as a bit line (or referred to as a local bit line) BL.

Referring to FIG. 2E, the method of forming the string selection line SSL in the upper portion of the stack structure SK2 includes, for example, forming a string selection line cut slit SLC extending in the direction D1 in the upper portion of the stack structure SK2. The string selection line cut slit SLC is an insulating material, such as silicon oxide, to separate the upper conductive layers 126 of the stack structure SK2 in each block B from each other. The string selection line cut slit SLC may be formed in the process of forming the metal interconnect structure 40, but the disclosure is not limited thereto, and the string selection line cut slit SLC may also be formed in advance, for example, before the staircase structure SCS is formed.

FIG. 5A to FIG. 5M are schematic cross-sectional views showing a method of fabricating a three-dimensional memory device according to an embodiment of the disclosure. FIG. 5A to FIG. 5M are schematic cross-sectional views showing a process of fabricating the semiconductor device of FIG. 1A.

Figures 5A, 5B:
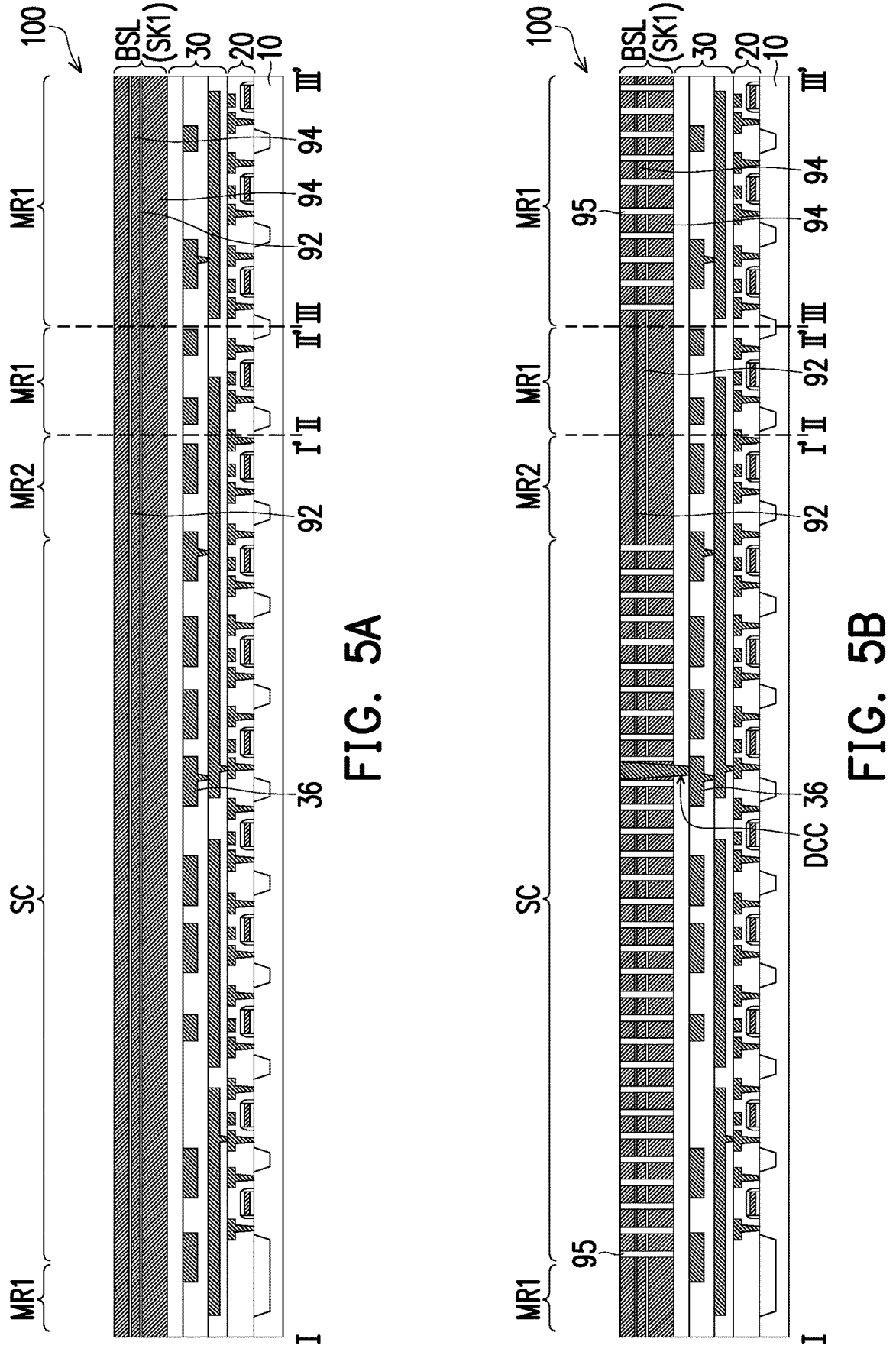
FIG. 5A to FIG. 5M are schematic cross-sectional views showing a method of fabricating a memory device according to an embodiment of the disclosure.

Referring to FIG. 5A, a substrate 10 is provided. A device layer 20 is formed on the substrate 10. A metal interconnect structure 30 is formed on the device layer 20. The metal interconnect structure 30 may be formed according to a single damascene process, a dual damascene process, or any other known methods. Next, a stack structure SK1 is formed on the metal interconnect structure 30. The stack structure SK1 includes a plurality of insulating layers 92 and a plurality of conductive layers 94 stacked alternately on each other along the Z direction. In an embodiment, the material of the insulating layer 92 includes silicon oxide, and the material of the conductive layer 94 includes doped polysilicon. The numbers of the insulating layers 92 and the conductive layers 94 are not limited to those shown in the figures.

Referring to FIG. 5B, an insulating structure 95 is formed in the stack structure SK1. The method of forming the insulating structure 95 includes, for example, patterning the stack structure SK1 to form a plurality of grooves (not shown). Then, an insulating material (e.g., silicon oxide) is filled in the grooves, and a chemical-mechanical planarization process is performed to remove the excessive insulating material.

Next, a conductive pillar DCC is formed in the stack structure SK1. The method of forming the conductive pillar DCC includes, for example, forming an opening (not shown) in the stack structure SK1 through an etching process. The opening (not shown) is, for example, a hole or a trench. The opening exposes the surface of the conductive line 36 of the metal interconnect structure 30. The etching process is, for example, a dry etching process, a wet etching process, or a combination thereof. The opening may be in the shape of a cylinder, an elliptic cylinder, or a rectangular prism, and is not particularly limited. Next, a conductive material is formed in the opening, and then, a planarization process such as an etch-back process or a chemical-mechanical polishing process is performed to remove the excessive conductive material on the stack structure SK1 to form the conductive pillar DCC. The conductive pillar DCC is electrically connected to the topmost conductive line 36. In some embodiments, the topmost conductive line 36 electrically connected to the conductive pillar DCC is electrically connected to the substrate 10 and grounded. Therefore, the conductive pillar DCC may serve as a discharge path. In this embodiment, the conductive pillar DCC extends from the top surface of the stack structure SK1 to the bottom surface of the stack structure SK1. However, the embodiment of the disclosure is not limited thereto, and the conductive pillar DCC may extend from any one of the insulating layers 92 or the conductive layers 94 of the stack structure SK1, pass through the bottommost insulating layer 92, and extend to the bottom surface of the stack structure SK1 to be electrically connected to the conductive line 36.

Figure 5C:
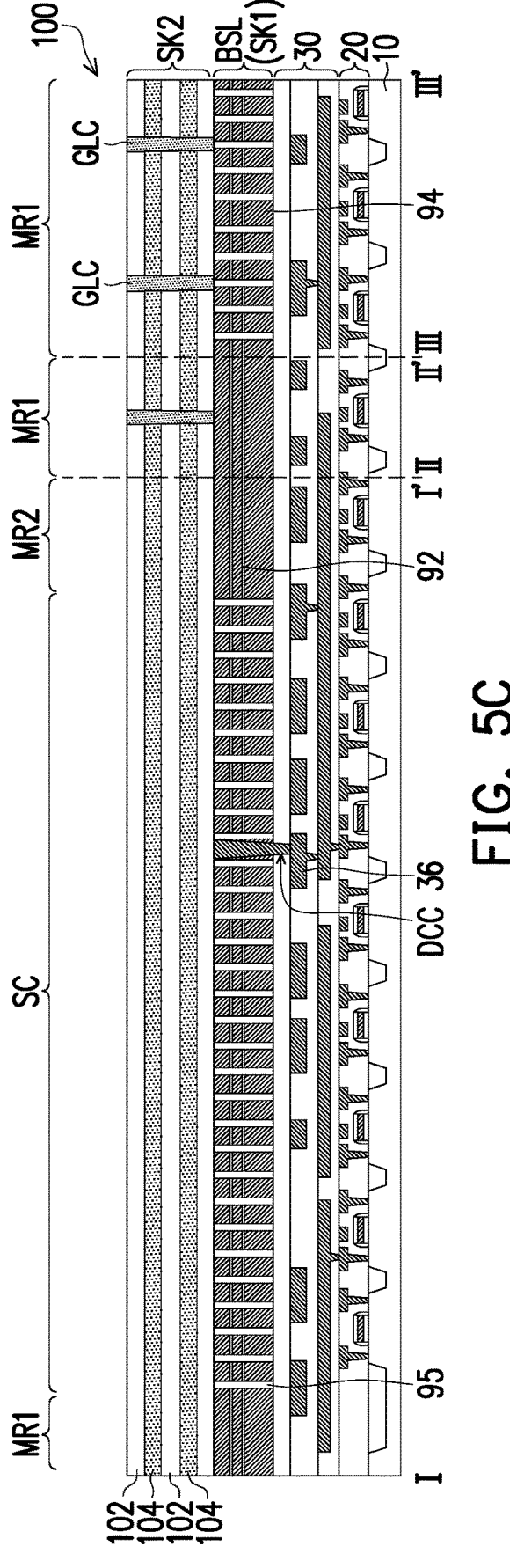

Referring to FIG. 5C, a plurality of insulating layers 102 and a plurality of middle layers 104 in the lower portion of the stack structure SK2 are formed on the substrate 10. In an embodiment, the material of the insulating layer 102 includes silicon oxide, and the material of the middle layer 104 includes silicon nitride. The middle layers 104 may serve as sacrificial layers and may be partially removed or completely removed in a subsequent process. Then, a bottom slit GLC is formed in the stack structure SK2. The method of forming the bottom slit GLC includes, for example, forming a trench (not shown) in the stack structure SK2 through lithography and etching processes, filling an insulating material (e.g., silicon oxide, SiN, SiON, SiC, SiCN, Al$_2$O$_3$, or a high dielectric constant material) into the trench, and then performing a chemical-mechanical planarization process to remove the excessive insulating material. A top view of the bottom slit GLC is shown in FIG. 4A.

Figure 5D:
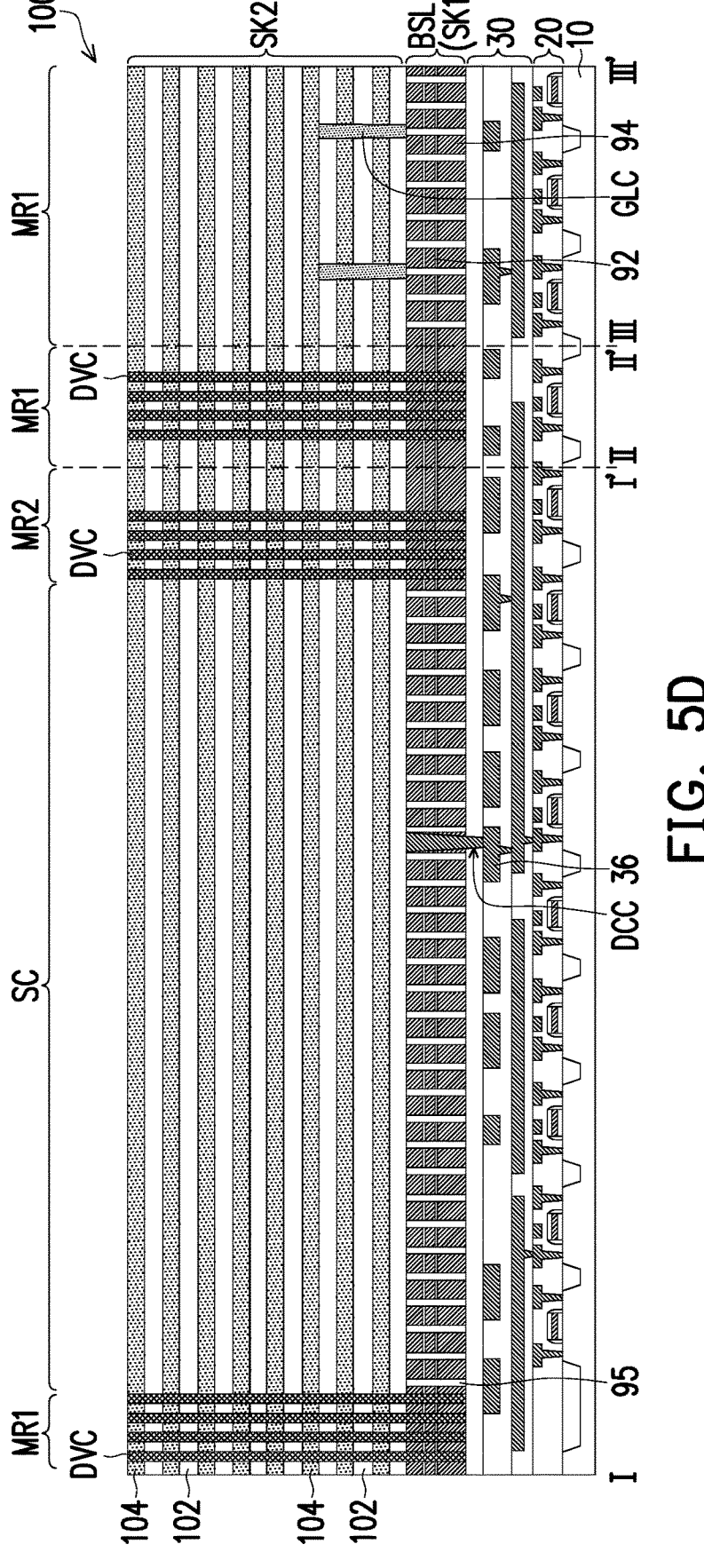

Referring to FIG. 5D, a plurality of insulating layers 102 and a plurality of middle layers 104 in another portion of the stack structure SK2 are formed on the substrate 10. Next, a plurality of dummy pillars DVC are formed through the stack structures SK2 and SK1. The plurality of dummy pillars DVC may be formed by forming openings (not shown) through single-stage lithography and etching processes or multi-stage lithography and etching processes, and then filling a filling material into the openings. The contour of the sidewall of the opening formed through multi-stage lithography and etching processes may be in a segmental shape, for example.

Figure 5E:
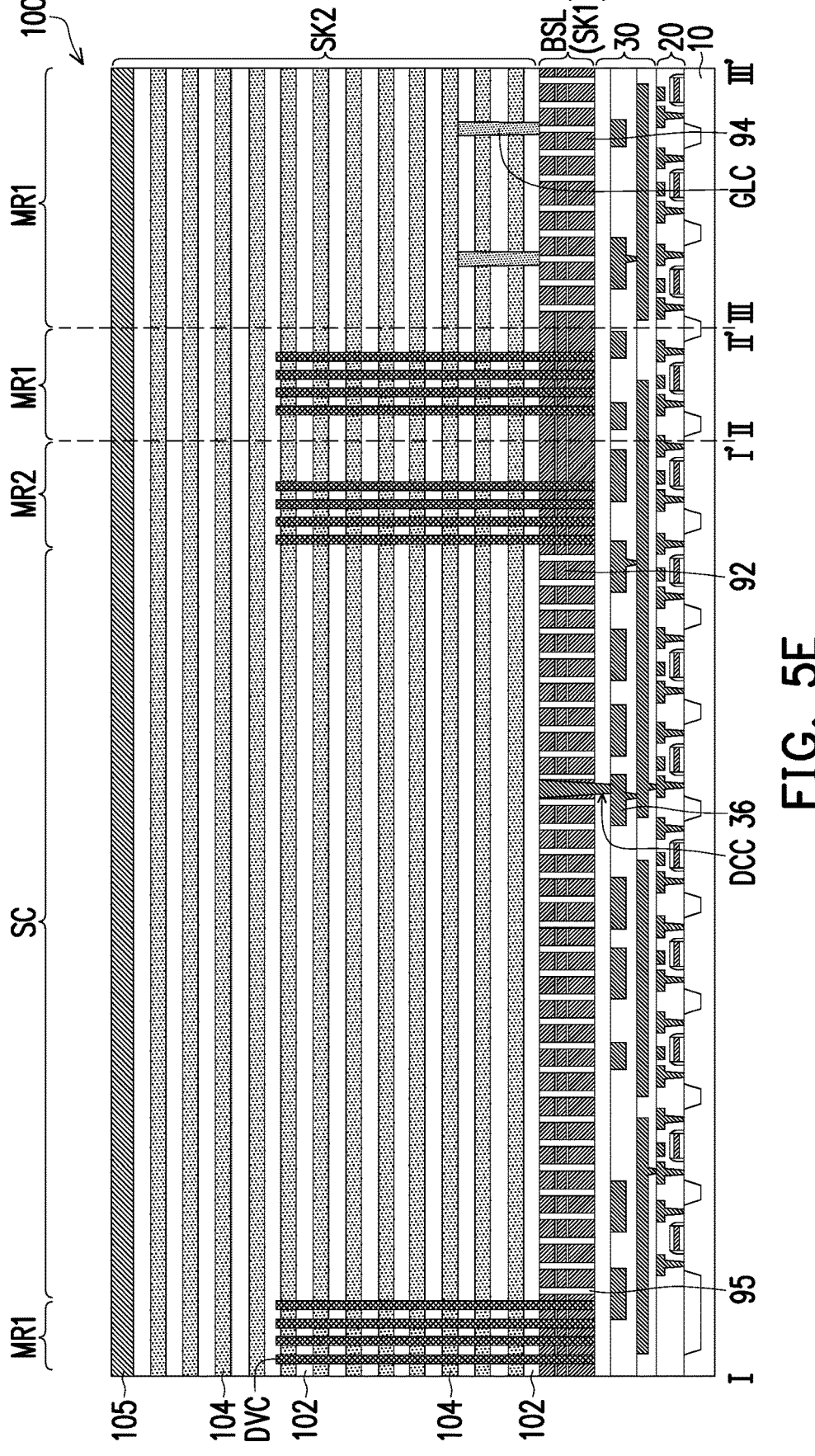

Referring to FIG. 5E, a plurality of insulating layers 102 and a plurality of middle layers 104 in the upper portion of the stack structure SK2 are formed on the substrate 10. Next, a stop layer 105 is formed on the stack structure SK2. The material of the stop layer 105 is different from the materials of the insulating layer 102 and the middle layer 104, and is, for example, polysilicon.

Figure 5F:
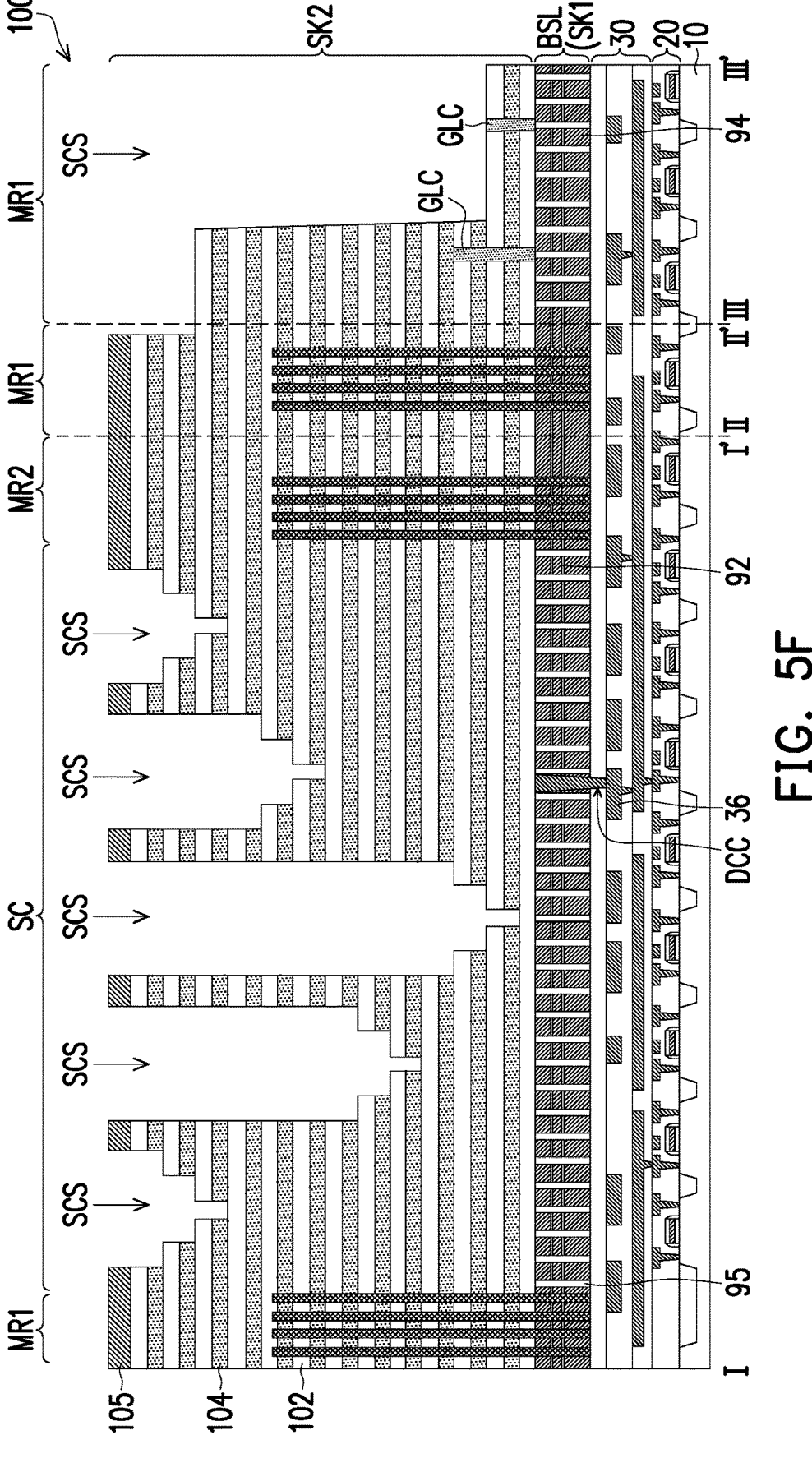

Referring to FIG. 5F, the middle layers 104 and the insulating layers 102 are patterned to form a staircase structure SCS and a plurality of staircase parts SCP (shown in FIG. 1A). In some embodiments, the staircase structure SCS and the plurality of staircase parts SCP may be formed through a multi-stage patterning process, but the disclosure is not limited thereto. The patterning process may include processes such as lithography, etching, and trimming.

Figure 5G:
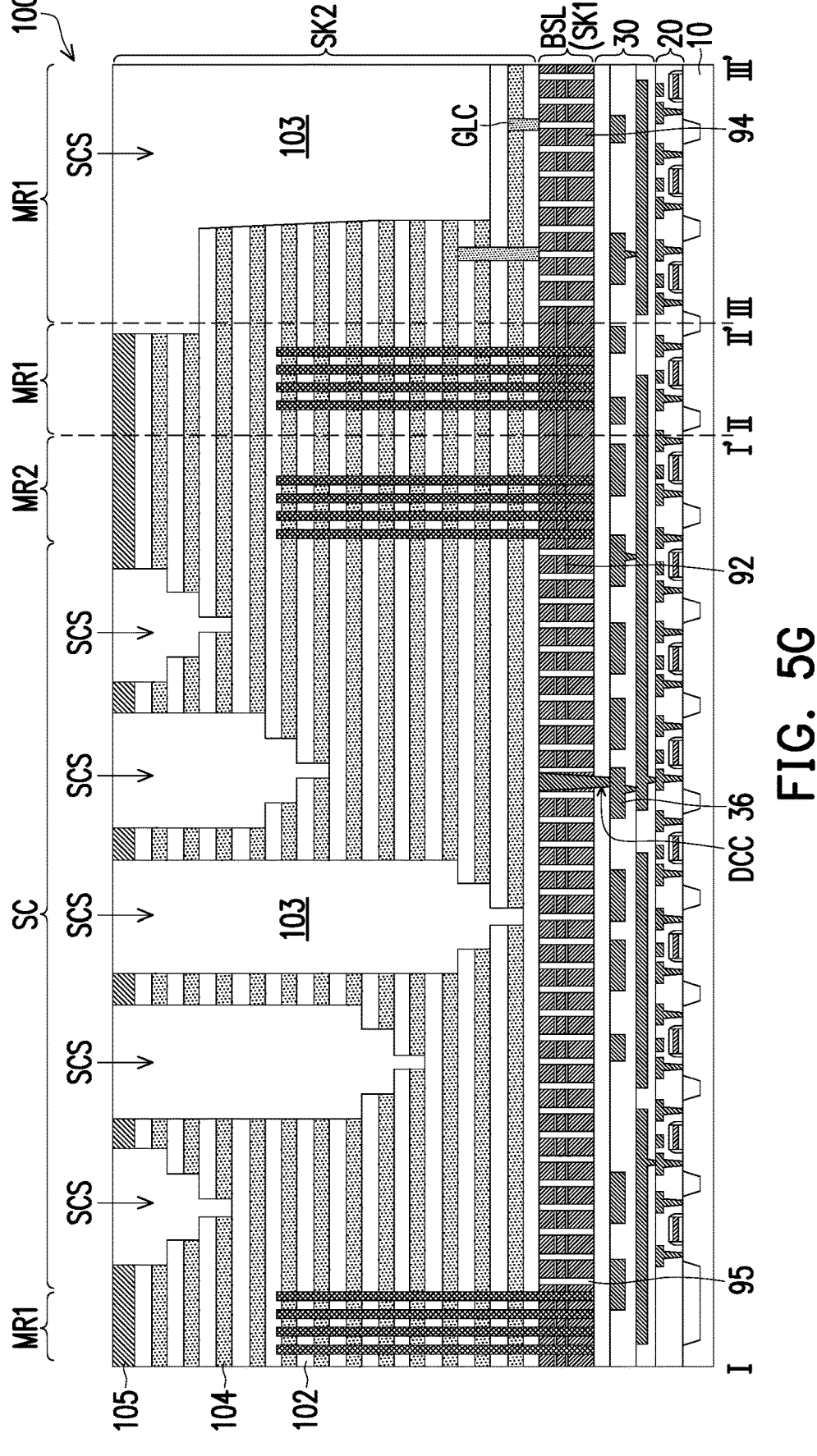

Referring to FIG. 5G, a dielectric layer 103 is formed over the substrate 10 to cover the staircase structure SCS. The material of the dielectric layer 103 is, for example, silicon oxide. The method of forming the dielectric layer 103 includes, for example, forming a dielectric material layer to fill and cover the staircase structure SCS. Afterwards, with the stop layer 105 serving as a polishing stop layer, a planarization process such as a chemical-mechanical polishing process is performed to remove the dielectric material layer higher than the stop layer 105.

Figure 5H:
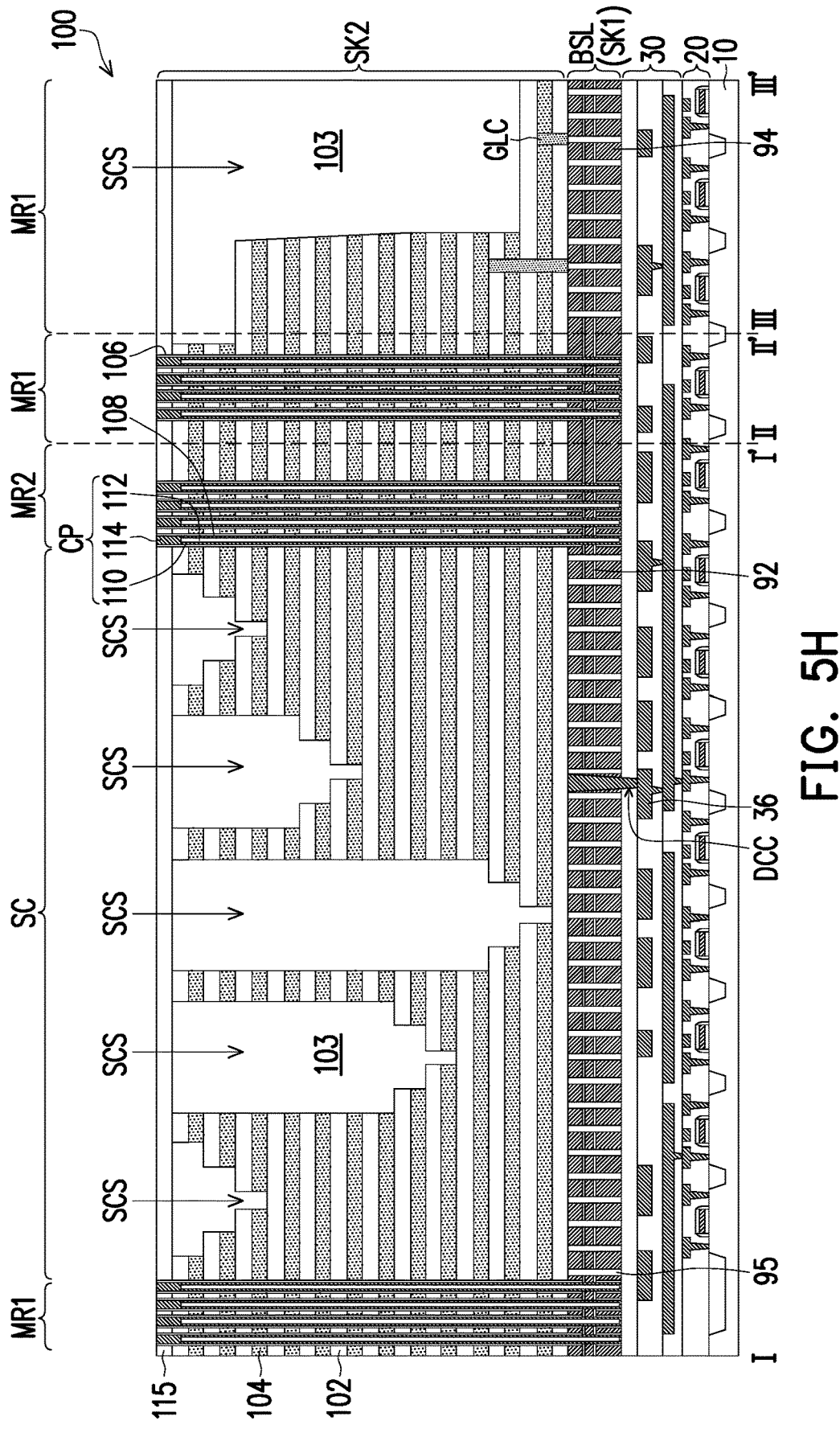

Referring to FIG. 5H, next, the stop layer 105 is removed. An insulating cap layer 115 is formed on the stack structure SK2. In an embodiment, the material of the insulating cap layer 115 includes silicon oxide. Next, a patterning process is performed to remove part of the insulating cap layer 115, part of the stack structure SK2, and part of the stack structure SK1 to form an opening (not shown) and expose the dummy pillar DVC. Then, the dummy pillar DVC exposed in the opening is removed to form one or more openings 106 passing through the insulating cap layer 115, the stack structure SK2, and the stack structure SK1. In an embodiment, the opening 106 may have a slightly inclined sidewall. In another embodiment, the opening 106 may have a substantially vertical sidewall (not shown). In an embodiment, the opening 106 is also referred to as a vertical channel (VC) opening. In an embodiment, the opening 106 may be formed through one-stage lithography and etching processes. In another embodiment, the opening 106 may be formed through multi-stage lithography and etching processes. In the etching process of forming the opening 106, the conductive pillar DCC may serve as a discharge path, so that the later formed upper portion of the opening 106 can be aligned with the earlier formed lower portion of the opening 106 that is located below. The contour of the sidewall of the opening 106 formed through multi-stage lithography and etching processes may be in a segmental shape, for example. Next, a vertical channel pillar CP is formed in the opening 106. The vertical channel pillar CP may be formed by a method described below.

First, referring to FIG. 5H again, a charge storage structure 108 is formed on the sidewall of the opening 106. The charge storage structure 108 is in contact with the insulating cap layer 115, the insulating layers 102, the middle layers 104, the insulating layers 92, and the conductive layers 94. In an embodiment, the charge storage structure 108 is an oxide/nitride/oxide (ONO) composite layer. The charge storage structure 108 is formed on the sidewall of the opening 106 in the form of a spacer and exposes the bottom surface of the opening 106.

Next, referring to FIG. 5H again, a channel layer 110 is formed in the charge storage structure 108. In an embodiment, the material of the channel layer 110 includes polysilicon. In an embodiment, the channel layer 110 is formed on an interior surface of the charge storage structure 108 and also covers the bottom surface of the opening 106. Next, an insulating pillar 112 is formed on an interior surface of the channel layer 110. In an embodiment, the material of the insulating pillar 112 includes silicon oxide. Afterwards, a conductive plug 114 is formed at the upper portion of the opening 106, and the conductive plug 114 is in contact with the channel layer 110. In an embodiment, the material of the conductive plug 114 includes polysilicon. The channel layer 110, the insulating pillar 112, and the conductive plug 114 may be collectively referred to as a vertical channel pillar CP. The charge storage structure 108 surrounds the vertical outer surface of the vertical channel pillar CP.

Figure 5I:
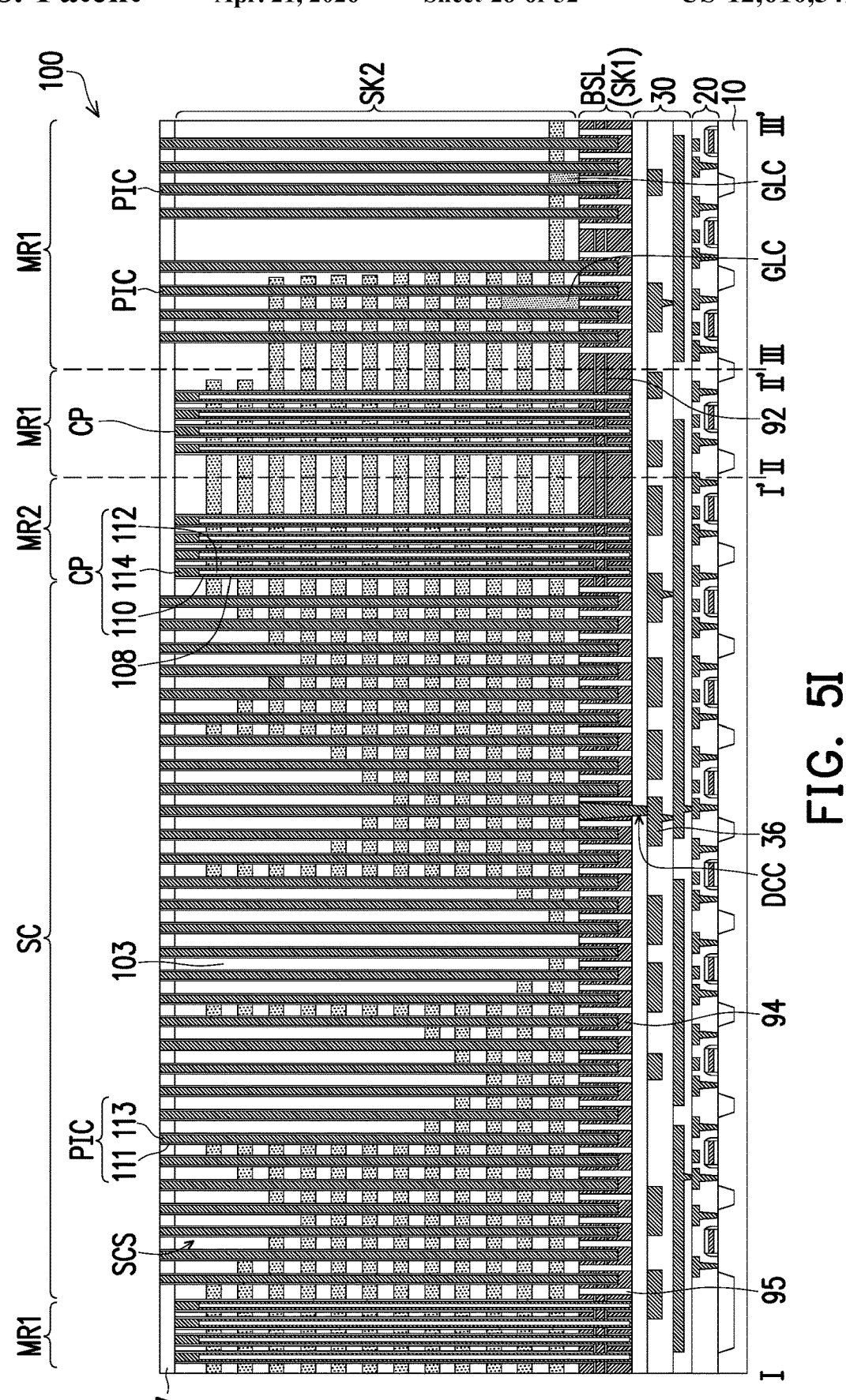

Then, referring to FIG. 5I, in some embodiments, after the vertical channel pillars CP are formed, another dielectric layer 107 may be formed first, and then a plurality of support structures PIC are formed. The support structure PIC may extend from the dielectric layer 107 to the stack structure SK1 to prevent the staircase structure SCS from collapsing in a subsequent removal process of the middle layers 104. The support structure PIC may include an insulating liner layer 111 and a conductive layer 113. In other embodiments, the support structure PIC may be formed simultaneously when the charge storage structure 108 and the vertical channel pillar CP are formed. The support structure PIC has the same structure as a combined structure of the charge storage structure 108 and the vertical channel pillar CP, but the disclosure is not limited thereto.

Figure 5J:
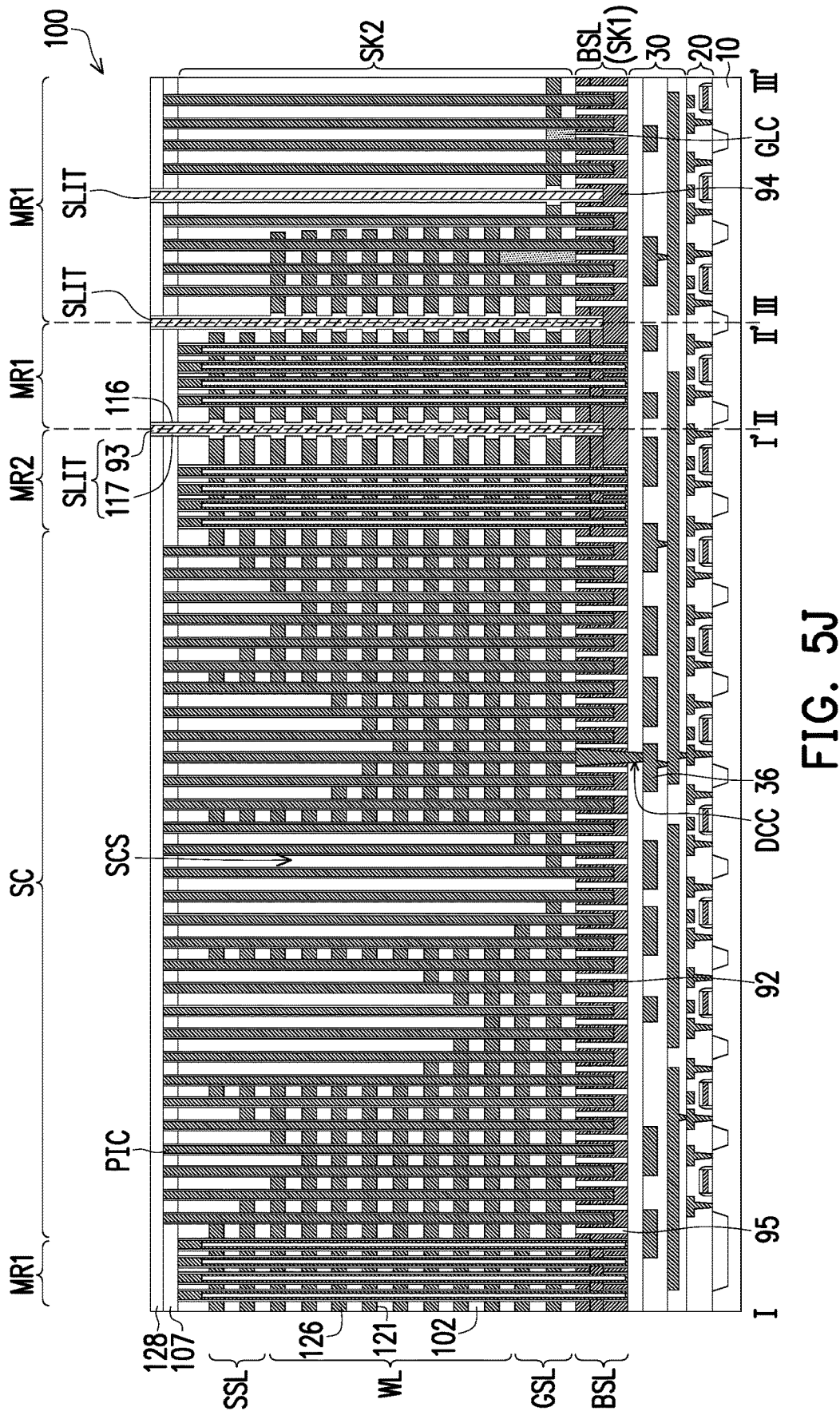

Referring to FIG. 5J, afterwards, a dielectric layer 128 is formed on the dielectric layer 107, and then a patterning process is performed to form a plurality of trenches 116. The trench 116 extends in the direction D1 and passes through the dielectric layer 128, the insulating cap layer 115, and the stack structure SK2 to divide the stack structure SK2 into a plurality of blocks B (e.g., a block B1 and a block B2). In an embodiment, as shown in FIG. 5J, the trench 116 may have a substantially vertical sidewall. In another embodiment, the trench 116 may have a slightly inclined sidewall (not shown).

Afterwards, a replacement process is performed to replace part of the middle layers 104 with conductive layers 126. First, a selective etching process is performed, so that an etchant passes by the trench 116 and the stack structure SK2 on its two sides. Accordingly, part of the middle layers 104 are removed to form a plurality of horizontal openings 121. The horizontal opening 121 exposes part of the charge storage structure 108, the upper and lower surfaces of the insulating layer 102, and the sidewall of the dielectric layer 103, and exposes part of the sidewall of the support structure PIC. The selective etching process may be isotropic etching such as a wet etching process. The etchant used in the wet etching process is, for example, a hot phosphoric acid. Then, a conductive layer 126 is formed in the trench 116 and the horizontal opening 121. The conductive layer 126 may serve as a gate layer 126. The conductive layer 126 includes, for example, a barrier layer and a metal layer. In an embodiment, the material of the barrier layer includes titanium (Ti), titanium nitride (TiN), tantalum (Ta), tantalum nitride (TaN), or a combination thereof. The material of the metal layer includes tungsten (W).

Referring to FIG. 5I and FIG. 5J, next, the conductive layer 126 formed in the trench 116 is removed and a spacer 117 is formed on the sidewall of the trench 116. The spacer 117 includes a dielectric material different from the material of the insulating layer 102, and may be, for example, silicon nitride or a silicon oxide/silicon nitride/silicon oxide composite layer. Afterwards, the depth of the trench 116 is increased, the middle conductive layer 94 of the stack structure SK1 is removed, and then the insulating layers 92 on and below the middle conductive layer 94 are removed, to form a horizontal opening 123 in the stack structure SK1. Then, a conductive layer 93, such as a doped polysilicon layer, is filled in the trench 116 and the horizontal opening 123. The conductive layer 93 in the horizontal opening 123 and the conductive layers 94 on and below the conductive layer 93 collectively form a source line BSL. The source line BSL may also be referred to as a common source conductive layer. After the source line BSL is formed, the conductive pillar DCC is embedded in the source line BSL. In some embodiments, the conductive layer 93 and the spacer 117 in the trench 116 collectively form a source line slit SLIT for conducting a current from the source line BSL. The source line slit SLIT is insulated by the spacer 117 to avoid contact with the conductive layers 126.

Figure 5K:
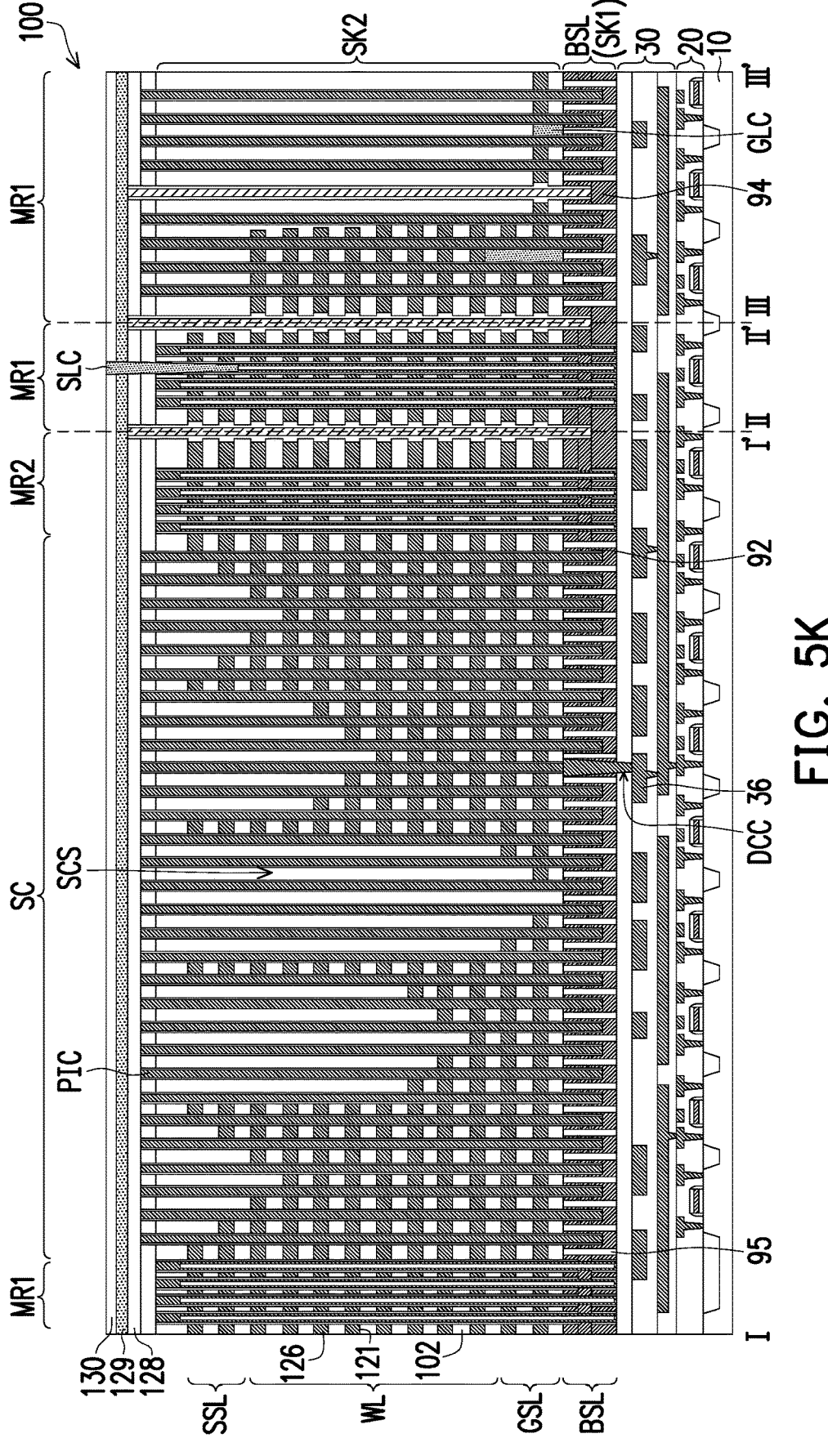

Referring to FIG. 5K, a stop layer 129 and a dielectric layer 130 are formed on the dielectric layer 128. The dielectric layers 128 and 130 are, for example, silicon oxide, and the stop layer 129 is, for example, silicon nitride. Next, a string selection line cut slit SLC extending into part of the stack structure SK2 is formed in the dielectric layer 130. The string selection line cut slit SLC is an insulating material such as silicon oxide and separates the upper conductive layers 126 of the stack structure SK2 from each other. The method of forming the string selection line cut slit SLC includes, for example, forming a trench through lithography and etching processes, and then filling an insulating material in the trench. The timing of forming the string selection line cut slit SLC is not limited thereto, and the string selection line cut slit SLC may also be formed in advance, for example, before the staircase structure SCS is formed.

Figure 5L:
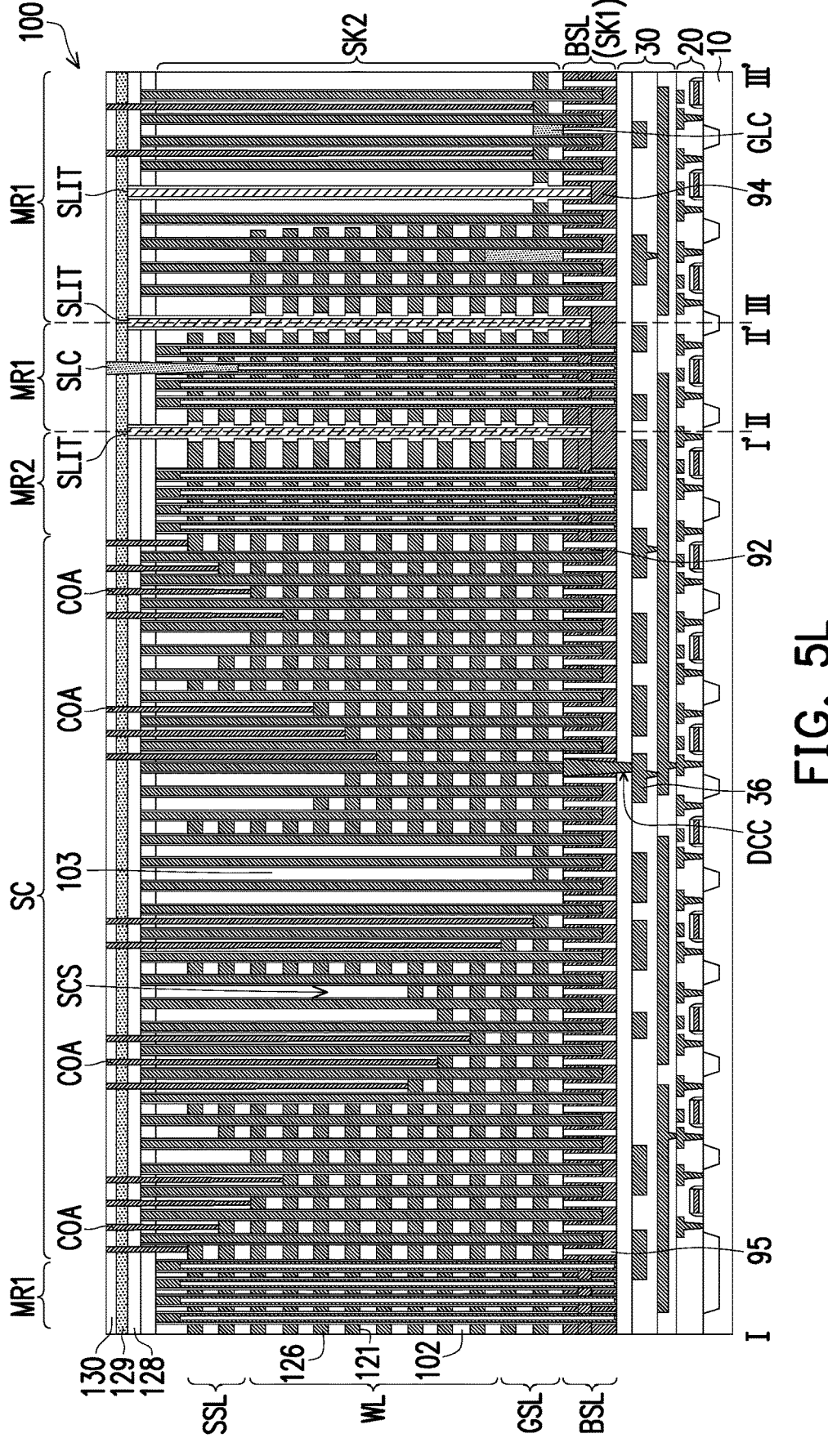
Figure 5M:
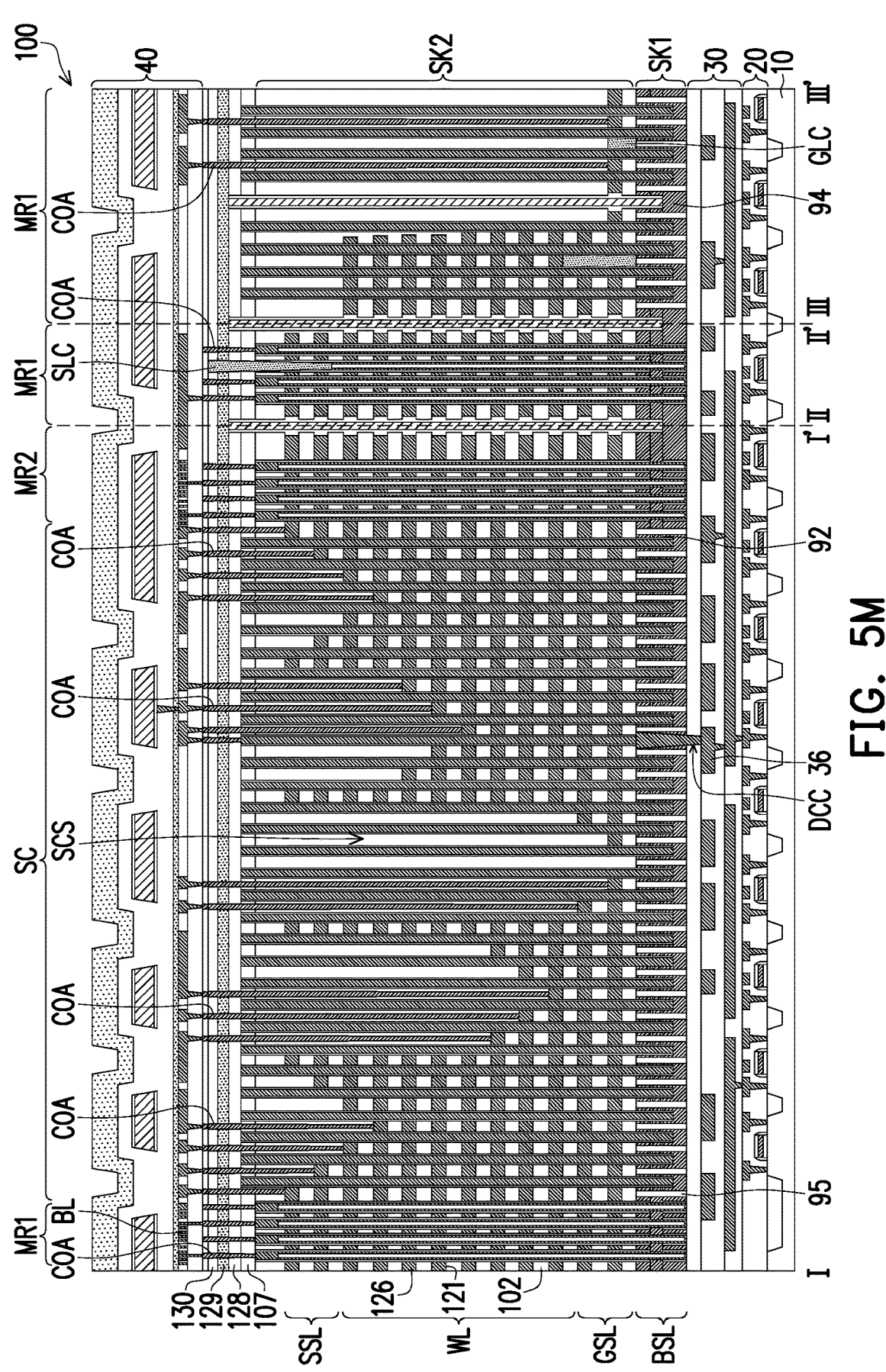

Referring to FIG. 5L and FIG. 5M, a plurality of contacts COA electrically connecting the conductive layer 126 and the vertical channel pillar CP are formed in the dielectric layer 130 to the dielectric layer 103. The contact COA may be formed by first forming a contact hole, and then filling a conductive material into the contact hole. Next, a metal interconnect structure 40 is formed. The metal interconnect structure 40 may be formed according to a single damascene process, a dual damascene process, or any other known methods.

In summary of the above, a memory device according to an embodiment of the disclosure can reduce wiring of a plurality of global selection line structures and reduce complexity of the fabrication process.

What is claimed is:

1. A memory device comprising:
a substrate comprising a first memory array area, a second memory array area, and a staircase structure area between the first memory array area and the second memory array area; and
a stack structure comprising a plurality of insulating layers and a plurality of conductive layers stacked alternately over the substrate in the first memory array area, the second memory array area and the staircase structure area,
wherein a lower portion of the stack structure comprises a plurality of global selection line structures in the first memory array area, the second memory array area and the staircase structure area,
wherein the plurality of global selection line structures comprises:
a first global selection line structure comprising:
a first long strip extending in a first direction, wherein the first long strip passes through the staircase structure area from the first memory array area extending continuously to the second memory array area;
a first short strip extending in the first direction; and
a first connection part extending in a second direction and connecting to the first long strip and the first short strip; and
a second global selection line structure adjacent to the first global selection line structure and divided into two portions separated from each other by the first connection part of the first global selection line structure.

2. The memory device according to claim 1, wherein the substrate comprises a first block which comprises a first region, a second region, a third region, and a fourth region, and the first memory array area and the second memory array area are respectively disposed at first ends and second ends of the first region, the second region, the third region, and the fourth region.

3. The memory device according to claim 2,
wherein the first global selection line structure comprises:
the first long strip disposed in the first region;
the first short strip disposed in the fourth region;
the first connection part disposed in the second region and the third region, connecting the first long strip and the first short strip, and located between the two portions of the second global selection line structure,
wherein each of the two portions of the second global selection line structure comprises:

a second long strip extending in the first direction disposed in the second region and laterally adjacent to the first long strip;
a second short strip extending in the first direction disposed in the third region and laterally adjacent to the first short strip; and
a second connection part extending in the second direction disposed in the second region and the third region, connecting the second long strip and the second short strip, and laterally adjacent to the first connection part.

4. The memory device according to claim 3, wherein the lower portion of the plurality of global selection line structures further comprise:
a third global selection line structure and a fourth global selection line structure located over the substrate in the first memory array area, the staircase structure area, and the second memory array area,
wherein the third global selection line structure is disposed in the third region and is divided into two portions extending in the first direction, by the first connection part of the first global selection line structure and the second short strip and the second connection part of the second global selection line structure, and
the fourth global selection line structure is disposed in the fourth region and is divided into two portions extending in the first direction, by the first short strip of the first global selection line structure.

5. The memory device according to claim 4, wherein the first short strip of the first global selection line structure has a first staircase part, the second short strip of the second global selection line structure has a second staircase part, the third global selection line structure has a third staircase part, and the fourth global selection line structure has a fourth staircase part,
wherein the first staircase part is disposed opposite to the fourth staircase part in the fourth region, and the second staircase part is disposed opposite to the third staircase part in the third region.

6. The memory device according to claim 5, wherein the first staircase part is symmetrical with the fourth staircase part, and the second staircase part is symmetrical with the third staircase part.

7. The memory device according to claim 5, further comprising a dielectric layer separating the first staircase part from the fourth staircase part, and separating the second staircase part from the third staircase part.

8. The memory device according to claim 7, further comprising:
a plurality of first contacts extending through the dielectric layer, landing on the first staircase part, and electrically connected to the first global selection line structure;
a plurality of second contacts extending through the dielectric layer, landing on the second staircase part, and electrically connected to the second global selection line structure;
a plurality of third contacts extending through the dielectric layer, landing on the third staircase part, and electrically connected to the third global selection line structure; and
a plurality of fourth contacts extending through the dielectric layer, landing on the fourth staircase part, and electrically connected to the fourth global selection line structure.

9. The memory device according to claim 8, further comprising:

a plurality of fifth contacts extending through the dielectric layer, landing on a staircase structure of the stack structure in the staircase structure area, and electrically connected to a plurality of conductive layers of the staircase structure.

10. The memory device according to claim 4, further comprising:

a plurality of first bottom slits separating the first global selection line structure from the second global selection line structure and separating the third global selection line structure from the fourth global selection line structure; and a first slit separating the second global selection line structure from the third global selection line structure.

11. The memory device according to claim 10, further comprising:

a plurality of second bottom slits connected to a plurality of first segments and a plurality of second segments of the first slit, wherein a plurality of third segments of the first slit are connected to the plurality of first bottom slits located between the first connection part and the second connection part; and a second slit located between a second block of the substrate and the first block and extending continuously from the first memory array area to the second memory array area.

12. A method of fabricating a memory device, comprising:

providing a substrate, wherein the substrate comprises a first memory array area, a second memory array area, and a staircase structure area between the first memory array area and the second memory array area;

forming a stack structure comprising a plurality of insulating layers and a plurality of conductive layers stacked alternately over the substrate in the first memory array area, the staircase structure area and the second memory array area, wherein a lower portion of the stack structure comprises a plurality of global selection line structures in the first memory array area, the second memory array area and the staircase structure area, wherein the plurality of global selection line structures comprises:

a first global selection line structure comprising:

a first long strip extending in a first direction, wherein the first long strip passes through the staircase structure area from the first memory array area extending continuously to the second memory array area;

a first short strip extending in the first direction; and a first connection part extending in a second direction and connecting to the first long strip and the first short strip; and a second global selection line structure adjacent to the first global selection line structure and divided into two portions separated from each other by the first connection part of the first global selection line structure.

13. The method of fabricating a memory device according to claim 12, wherein the substrate comprises a first block which comprises a first region, a second region, a third region, and a fourth region, and the first memory array area and the second memory array area are respectively at first ends and second ends of the first region, the second region, the third region, and the fourth region wherein the first global selection line structure comprises:

the first long strip disposed in the first region;

the first short strip disposed in the fourth region; and the first connection part disposed in the second region and the third region, connecting the first long strip and the first short strip, and located between the two portions of the second global selection line structure, wherein each of the two portions of the second global selection line structure comprises:

a second long strip extending in the first direction disposed in the second region and laterally adjacent to the first long strip;

a second short strip extending in the first direction disposed in the third region and laterally adjacent to the first short strip; and a second connection part extending in the second direction disposed in the second region and the third region, connecting the second long strip and the second short strip, and laterally adjacent to the first connection part.

14. The method of fabricating a memory device according to claim 13, wherein the plurality of global selection line structures further comprises:

a third global selection line structure and a fourth global selection line structure over the substrate, wherein the third global selection line structure is divided into the two portions by the first connection part of the first global selection line structure and the second short strip and the second connection part of the second global selection line structure, wherein the fourth global selection line structure is divided into the two portions by the first short strip of the first global selection line structure.

15. The method of fabricating a memory device according to claim 14, further comprising:

forming a first bottom slit and a second bottom slit in the lower portion of the stack structure;

forming a first slit in an upper portion to the lower portion of the stack structure, wherein the plurality of first bottom slits separate the first global selection line structure from the second global selection line structure and separate the third global selection line structure from the fourth global selection line structure, the first slit and the second bottom slits separate the second global selection line structure from the third global selection line structure.

16. The method of fabricating a memory device according to claim 14, wherein the first short strip of the first global selection line structure has a first staircase part, the second short strip of the second global selection line structure has a second staircase part, the third global selection line structure has a third staircase part, and the fourth global selection line structure has a fourth staircase part, wherein the first staircase part is disposed opposite to the fourth staircase part in the fourth region, and the second staircase part is disposed opposite to the third staircase part in the third region.

17. A memory device, comprising:

a substrate comprising a first memory array area, a second memory array area, and a staircase structure area between the first memory array area and the second memory array area;

a stack structure comprising a plurality of insulating layers and a plurality of conductive layers stacked alternately over the substrate in the first memory array area, the second memory array area and the staircase structure area, wherein a lower portion of the stack structure comprises a plurality of global selection line structures in the first memory array area, the second memory array area and the staircase structure area, wherein the plurality of global selection line structures comprises:

a first global selection line structure comprising:

a first long strip extending in a first direction, wherein the first long strip passes through the staircase structure area from the first memory array area extending continuously to the second memory array area;

a first short strip extending in the first direction; and a first connection part extending in a second direction and connecting to the first long strip and the first short strip; and a second global selection line structure adjacent to the first global selection line structure and divided into two portions separated from each other by the first connection part of the first global selection line structure;

a bottom slit separating the second global selection line structure from the first global selection line structure; and wherein each of the plurality of conductive layers over the first long strip, the first short strip and the first connection part of the first global selection line structure is integrated.

18. The memory device according to claim 17, wherein the second global selection line structure comprises a second long strip, a second short strip, and a second connection part connecting to the second long strip through the second connection part, and each of the plurality of conductive layers are further disposed over the second long strip, the second short strip, and the second connection part, wherein each of the plurality of conductive layers over the second long strip, the second short strip, and the second connection part is integrated.

19. The memory device according to claim 17, wherein the plurality of global selection line structures further comprises:

a third global selection line structure, wherein the third global selection line structure is divided into the two portions by the first connection part of the first global selection line structure and the second short strip and the second connection part of the second global selection line structure; and a fourth global selection line structure, wherein the fourth global selection line structure is divided into the two portions by the first short strip of the first global selection line structure, wherein each of the plurality of conductive layers are further disposed over the third global selection line structure and the fourth global selection line structure, wherein each of the plurality of conductive layers over the third global selection line structure and the fourth global selection line structure is integrated.

20. The memory device according to claim 19, wherein the first short strip of the first global selection line structure has a first staircase part, the second short strip of the second global selection line structure has a second staircase part, the third global selection line structure has a third staircase part, and the fourth global selection line structure has a fourth staircase part, wherein the first staircase part is disposed opposite to the fourth staircase part, and the second staircase part is disposed opposite to the third staircase part.

* * * * *